(12) United States Patent
Nakanishi

(10) Patent No.: US 11,056,521 B2
(45) Date of Patent: Jul. 6, 2021

(54) IMAGING DEVICE AND IMAGE SENSOR

(71) Applicant: NIKON CORPORATION, Tokyo (JP)

(72) Inventor: Sota Nakanishi, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/476,437

(22) PCT Filed: Mar. 27, 2018

(86) PCT No.: PCT/JP2018/012506
§ 371 (c)(1),
(2) Date: Jul. 8, 2019

(87) PCT Pub. No.: WO2018/181358
PCT Pub. Date: Oct. 4, 2018

(65) Prior Publication Data
US 2020/0058694 A1     Feb. 20, 2020

(30) Foreign Application Priority Data

Mar. 27, 2017  (JP) .............................. JP2017-060527

(51) Int. Cl.
| | |
|---|---|
| *H01L 27/146* | (2006.01) |
| *H01L 21/00* | (2006.01) |
| *G03B 17/14* | (2021.01) |
| *H04N 5/225* | (2006.01) |

(52) U.S. Cl.
CPC .. *H01L 27/14621* (2013.01); *H01L 27/14609* (2013.01); *H01L 27/14627* (2013.01); *G03B 17/14* (2013.01); *H04N 5/2254* (2013.01)

(58) Field of Classification Search
CPC .......................... H01L 27/14609; H04N 5/2254

USPC ................. 438/57, 69, 70; 257/98, 444, 462
See application file for complete search history.

(56) References Cited

U.S. PATENT DOCUMENTS

| | | | |
|---|---|---|---|
| 9,172,877 B2 * | 10/2015 | Morimoto | .............. H04N 5/332 |
| 2003/0010981 A1 | 1/2003 | Sekine | |
| 2006/0139780 A1 | 6/2006 | Matsumoto | |
| 2009/0027518 A1 | 1/2009 | Kita | |

(Continued)

FOREIGN PATENT DOCUMENTS

| | | |
|---|---|---|
| JP | H04-070720 A | 3/1992 |
| JP | 2002-320236 A | 10/2002 |

(Continued)

OTHER PUBLICATIONS

Jun. 26, 2018 Search Report issued in International Application No. PCT/JP2018/012506.

(Continued)

*Primary Examiner* — Calvin Lee
(74) *Attorney, Agent, or Firm* — Oliff PLC

(57) ABSTRACT

An imaging device, includes: an imaging unit in which are disposed a plurality of pixels, each including a filter that is capable of changing a wavelength of light passing therethrough to a first wavelength and to a second wavelength and a light reception unit that receives light that has passed through the filter, and that captures an image via an optical system; an analysis unit that analyzes the image captured by the imaging unit; and a control unit that controls the wavelength of the light to be transmitted, by the filter based upon a result of analysis by the analysis unit.

17 Claims, 14 Drawing Sheets

(56) References Cited

U.S. PATENT DOCUMENTS

2013/0195347 A1    8/2013   Okada et al.
2014/0232912 A1    8/2014   Morimoto
2019/0222741 A1*   7/2019   Tsunai .................. H04N 5/369

FOREIGN PATENT DOCUMENTS

| JP | 2003-007995 A | 1/2003 |
| JP | 2006-178320 A | 7/2006 |
| JP | 2009-118359 A | 5/2009 |
| JP | 2013-85028 A  | 5/2013 |
| JP | 2013-157671 A | 8/2013 |

OTHER PUBLICATIONS

Jun. 2, 2020 Office Action issued in Japanese Patent Application No. 2019-509911.
Jul. 30, 2020 Office Action issued in Chinese Patent Application No. 201880013721.2.

* cited by examiner (a)

BAYER ARRAY (b)

LAYOUT ALONG HORIZONTAL DIRECTION EMPHASIZED (a)

(b)

(a) LAYOUT ALONG VERTICAL DIRECTION EMPHASIZED (b)

(a)

BAYER ARRAY (b)

LAYOUT ALONG HORIZONTAL DIRECTION EMPHASIZED (a)

(b)

(a) LAYOUT ALONG VERTICAL DIRECTION EMPHASIZED (b)

LAYOUT ALONG HORIZONTAL DIRECTION EMPHASIZED (a)

(b)

LAYOUT ALONG VERTICAL DIRECTION EMPHASIZED (a)

(b)

LAYOUT ALONG HORIZONTAL DIRECTION EMPHASIZED (a)

LAYOUT ALONG VERTICAL DIRECTION EMPHASIZED (b)

IMAGING DEVICE AND IMAGE SENSOR

TECHNICAL FIELD

The present invention relates to an imaging device and to an image sensor.

BACKGROUND ART

An imaging device is per se known (refer to PTL 1) that includes, for each pixel, a variable wavelength filter that passes a wavelength that can be varied. However, with prior art imaging devices, there has been the problem that sometimes the transmission wavelengths that are set for the various pixels are not suitable for the photographic subject.

CITATION LIST

Patent Literature

PTL 1: Japanese Laid-Open Patent Publication 2013-85028.

SUMMARY OF INVENTION

According to the 1st aspect, an imaging device, comprises: an imaging unit in which are disposed a plurality of pixels, each including a filter that is capable of changing a wavelength of light passing therethrough to a first wavelength and to a second wavelength and a light reception unit that receives light that has passed through the filter, and that captures an image via an optical system; an analysis unit that analyzes the image captured by the imaging unit; and a control unit that controls the wavelength of the light to be transmitted, by the filter based upon a result of analysis by the analysis unit.

According to the 2nd aspect, an imaging device, comprises: filters that are capable of changing between a first state of passing light of a first wavelength, and a second state of passing light of a second wavelength; light reception units that receive light that has passed through the filters, and that output signals; and a control unit that controls the filters to be in the first state or to be in the second state, based upon the signals outputted from the light reception units.

According to the 3rd aspect, an imaging device, comprises: filters that are capable of changing between a first state of passing light of a first wavelength from a subject, and a second state of passing light of a second wavelength; light reception units that receive light that has passed through the filters, and that output signals; and a control unit that detects light from the subject, and controls the filters to be in the first state or to be in the second state.

According to the 4th aspect, an imaging device, comprises: filters that are capable of changing between a first state of passing light of a first wavelength, and a second state of passing light of a second wavelength; light reception units that receive light that has passed through the filters, and that output signals; a detection unit that detects spatial frequency components of an image based upon the signals outputted from the light reception unit; and a control unit that controls the filters to the first state or to the second state, based upon the spatial frequency components detected by the detection unit.

According to the 5th aspect, an image sensor, comprises: filters that are capable of changing between a first state of passing light of a first wavelength, and a second state of passing light of a second wavelength; light reception units that receive light that has passed through the filters, and that output signals; and a control unit that controls the filters to the first state or to the second state, based upon the signals outputted from the detection unit.

DESCRIPTION OF EMBODIMENTS

First Embodiment

Figure 1:
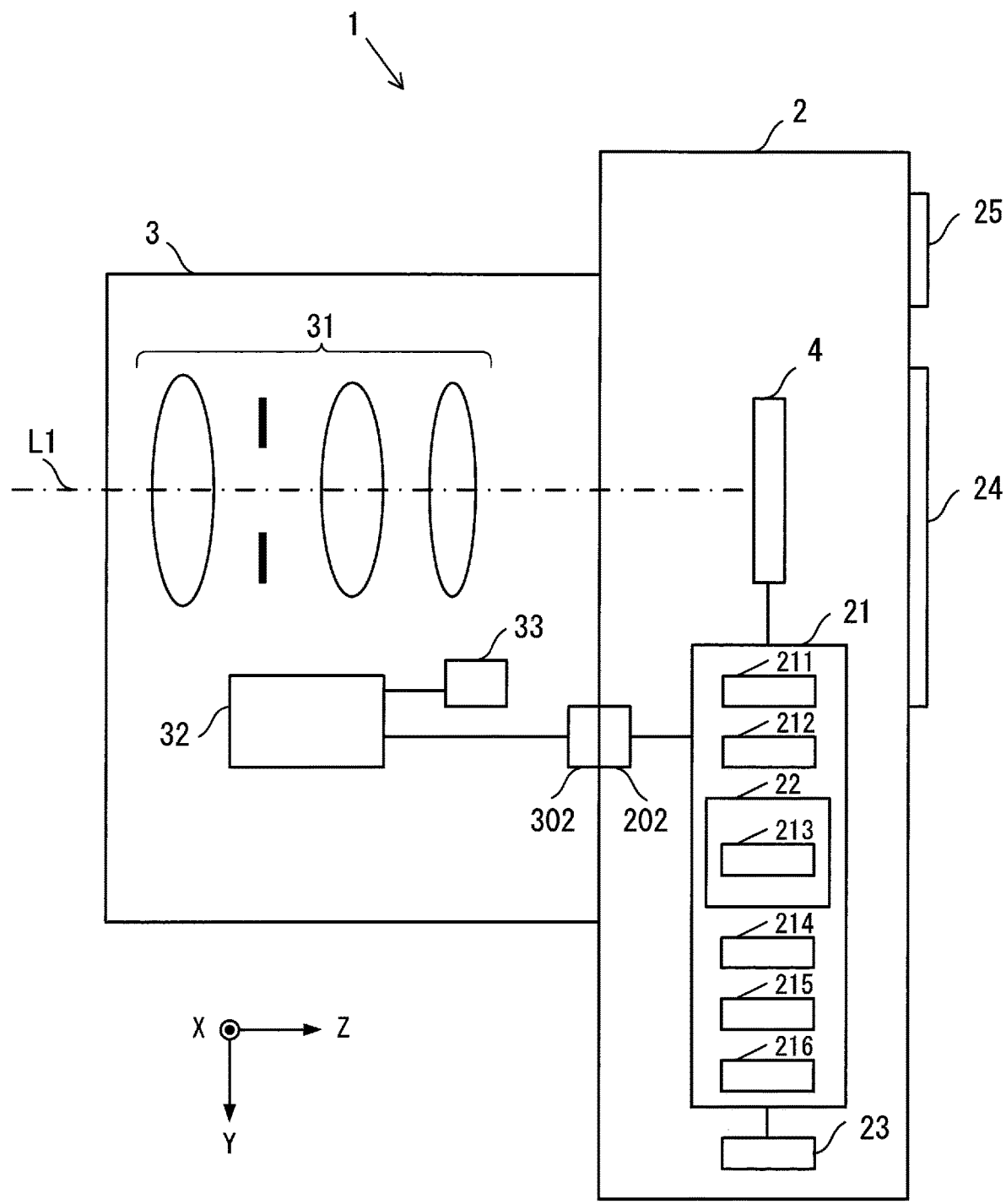
FIG. 1 is a block diagram showing the structure of an imaging device according to a first embodiment.

FIG. 1 is a block diagram showing the structure of an electronic camera (hereinafter termed the "camera 1"), which is an example of an imaging device (image-capturing device) according to a first embodiment. This camera 1 is built to include a camera body 2 and an interchangeable lens 3. The interchangeable lens 3 is detachable installed to the camera body 2 via a mounting portion not shown in the figures. When the interchangeable lens 3 is thus installed to the camera body 2, a connection portion 202 on the camera body 2 side and a connection portion 302 on the interchangeable lens 3 side are connected together, and communication between the camera body 2 and the interchangeable lens 3 becomes possible.

In FIG. 1, light from a photographic subject is incident in the +Z axis direction in FIG. 1. Moreover, as shown by the illustrated coordinate axes, the direction forward from the drawing paper and orthogonal to the Z axis is taken as being the +X axis direction, and the direction orthogonal to the Z axis and to the X axis and downward is taken as being the +Y axis direction. In the following figures, taking the coordinate axes of FIG. 1 as reference, coordinate axes are displayed so that the orientation of each figure can be understood.

The interchangeable lens 3 includes an imaging optical system (i.e. an image formation optical system) 31, a lens control unit 32, and a lens memory 33. The imaging optical system 31 includes a plurality of lenses that include a focus adjustment lens (i.e. a focusing lens) and an aperture, and forms a subject image upon an image formation surface of an image sensor (imaging element) 4 of the camera body 2.

On the basis of a signal outputted from the body control unit 21 of the camera body 2, the lens control unit 32 adjusts the focal point position of the imaging optical system 31 by shifting the focus adjustment lens forward and backward along the direction of its optical axis L1. Moreover, the lens control unit 32 controls the diameter of the aperture on the basis of a signal outputted from the body control unit 21 of the camera body 2.

The lens memory 33 is, for example, built around a non-volatile storage medium or the like. Information corresponding to the interchangeable lens 3 is stored in the lens memory 33 as lens information. Writing of lens information into the lens memory 33 and reading out of lens information from the lens memory 33 are performed by the lens control unit 32.

The camera body 2 includes the body control unit 21, the image sensor 4, a memory 23, a display unit 24, and a control unit 25. The image sensor 4 is, for example, a CMOS image sensor or a CCD image sensor. And the image sensor 4 receives a light flux that has passed through the imaging optical system 31, and captures a subject image. A plurality of pixels that include photoelectric conversion units are disposed in the image sensor 4 along a row direction (i.e. the horizontal direction) which is a first direction, and along a column direction (i.e. the vertical direction) which is a second direction and intersects the first direction. The photoelectric conversion units are, for example, built around photo-diodes (PDs). The image sensor 4 includes this plurality of pixels having photoelectric conversion units, and is an imaging unit 4 that captures a subject image via the imaging optical system 31. The image sensor 4 photoelectrically converts incident light and generates pixel signals, and outputs the pixel signals that have thus been generated to the body control unit 21. These pixel signals are signals generated on the basis of electric charges that have been photoelectrically converted by the photoelectric conversion units.

The memory 23 is a recording medium such as, for example, a memory card or the like. Image data and so on is recorded in the memory 23. Writing of data into the memory 23 and reading out of data from the memory 23 are performed by the body control unit 21. The display unit 24 displays images based upon image data, information related to photography such as shutter speed and aperture value and so on, and menu screens and so on. And the control unit 25 includes a release button and setting switches of various types such as a power supply switch and so on, and outputs actuation signals corresponding to actuation thereof to the body control unit 21.

The body control unit 21 is built around a CPU, ROM, RAM and so on, and controls the various sections of the camera 1 on the basis of a control program. Moreover, the body control unit 21 includes a photographic mode setting unit 211, a focus detection unit 212, an analysis unit 22 that includes a frequency characteristic detection unit 213, a filter control unit 214, a first image data generation unit 215, and a second image data generation unit 216.

The photographic mode setting unit 211 sets a photographic mode on the basis of an actuation signal outputted from the control unit 25. For example, when half press actuation of the release button has been detected, then, on the basis of this actuation signal, the photographic mode setting unit 211 sets a first photographic mode in which a through image (a live view image) that will be described hereinafter, in other words image data for display, is generated and displayed upon the display unit 24. It should be understood that it would be acceptable to arrange for this first photographic mode to be set on the basis of the power supply switch going to ON. Moreover, when full press actuation of the release button has been detected, then, on the basis of this actuation signal, the photographic mode setting unit 211 sets a second photographic mode in which image data for recording is generated, and this image data is recorded in the memory 23. Here, the image data may be image data for a still image or image data for a video image.

The focus detection unit 212 performs processing required for automatic focus adjustment (AF) of the imaging optical system 31. In concrete terms, while shifting the focus adjustment lens of the imaging optical system 31 by a predetermined distance each time along the direction of the optical axis, for each of these predetermined distances, the focus detection unit 212 sequentially calculates evaluated contrast values of the subject image on the basis of the pixel signals from the image sensor 4. And the focus detection unit 212 calculates the position of the focus adjustment lens that yields the peak of these evaluated contrast values, in other words their maximum value, as being its focused position. The focus detection unit 212 then outputs a signal relating to the focused position that has thus been calculated to the lens control unit 32. And the lens control unit 32 performs focus adjustment by shifting the focus adjustment lens to this focused position.

The analysis unit 22 analyzes the subject image that has been formed by the imaging optical system 31. For example, the analysis unit 22 detects spatial frequency characteristics of the subject image by employing the frequency characteristic detection unit 213. In concrete terms, the frequency characteristic detection unit 213 detects spatial frequency characteristics of the subject image on the basis of the pixel signals from the pixels outputted from the image sensor 4. Such spatial frequency characteristics may, for example, be obtained by frequency analysis of all of the image (data) or of part of the image, and are characteristics that represent the image by components for various spatial frequencies (amplitude strength, signal strength). For example, the spatial frequency characteristics may be represented by a spatial frequency distribution specifying a relationship between various spatial frequencies and the components for each spatial frequency, and may indicate a periodic pattern upon the image or the degree of repetition of the image.

The frequency characteristic detection unit 213 calculates the high frequency components of the spatial frequency of the subject image in the horizontal direction (i.e. in the row direction of the pixel array) and the high frequency components of the spatial frequency of the subject image in the vertical direction (i.e. in the column direction of the pixel array), and detects the spatial frequency characteristics of the subject image on the basis of the high frequency components that have been calculated. And, as will be described in detail hereinafter, the frequency characteristic detection unit 213 calculates the high frequency components of the spatial frequency for each color component (the R component, the G component, and the B component) of the subject image. The high frequency components of the spatial frequency of the subject image are the components (the amplitude strength and the signal strength), among the frequency components of the subject image, that are of relatively high frequency. For example, a high frequency component of the subject image is the component, among the spatial frequency components of the subject image, of spatial frequency corresponding to the pixel pitch d (i.e. to the gaps between the pixels) which will be described hereinafter. It should be understood that the high frequency components are not limited to the above; one of them may be a frequency component corresponding to twice the gaps, i.e. to 2d. Furthermore, the sum of a plurality of frequency components may also be a high frequency component. Yet further, a value obtained by integrating the differences between the pixel signals from adjacent pixels may also be employed as a high frequency component of the subject image.

If the high frequency component of the spatial frequency in the horizontal direction is greater than the high frequency component of the spatial frequency in the vertical direction by a predetermined amount T1 or more, in other words by a predetermined amount or more, then the frequency characteristic detection unit 213 detects the spatial frequency characteristic of the subject image as being a first spatial frequency characteristic.

And if the high frequency component of the spatial frequency in the vertical direction is greater than the high frequency component of the spatial frequency in the horizontal direction by the predetermined amount T1 or more, in other words by the predetermined amount or more, then the frequency characteristic detection unit 213 detects the spatial frequency characteristic of the subject image as being a second spatial frequency characteristic.

But if the high frequency component of the spatial frequency in the horizontal direction and the high frequency component of the spatial frequency in the vertical direction are approximately equal, in other words if the difference between these two high frequency components is within the predetermined amount T1 described above, then the frequency characteristic detection unit 213 detects the spatial frequency characteristic of the subject image as being a third spatial frequency characteristic.

In this manner, in this embodiment, the frequency characteristic detection unit 213 detects to which of the first, the second, and the third spatial frequency characteristics the spatial frequency characteristic of the subject image belongs.

The frequency characteristic detection unit 213 calculates the high frequency components of the spatial frequencies by, for example, performing high speed Fourier transform (FFT) processing upon the pixel signals from the image sensor 4. Moreover, it would also be acceptable to arrange for the frequency characteristic detection unit 213 to calculate the high frequency components of the spatial frequencies by performing high speed Fourier transform processing upon image data generated by the first image data generation unit 215 or by the second image data generation unit 216.

Furthermore, instead of employing high speed Fourier transform processing, the frequency characteristic detection unit 213 may calculate the high frequency components of the spatial frequency by performing the following calculation processing. That is, the frequency characteristic detection unit 213 may calculate the differences between the pixel signals of pixels that are disposed to be adjacent in the row direction, and may calculate the high frequency components of the spatial frequency in the horizontal direction by integrating those differences. And, in a similar manner, the frequency characteristic detection unit 213 may calculate the differences between the pixel signals of pixels that are disposed to be adjacent in the column direction, and may calculate the high frequency components of the spatial frequency in the vertical direction by integrating those differences.

The filter control unit 214 controls the pixel color arrangement of the image sensor 4 on the basis of the result of analysis of the subject image by the analysis unit 22. It may be said that the filter control unit 214 controls the position of the pixels of the image sensor 4 on the basis of the result of analysis of the subject image. For example, the filter control unit 214 may control the pixel color arrangement of the image sensor 4 on the basis of the spatial frequency characteristics of the subject image detected by the frequency characteristic detection unit 213, thus changing the resolution (i.e. the resolving power) of the image sensor 4. Although the details will be described hereinafter, the filter control unit 214 changes the resolution by controlling the transmission wavelengths of the variable wavelength filters of the pixels of the image sensor 4.

It should be understood that it would also be acceptable to arrange for the filter control unit 214 to control the transmission wavelengths of the variable wavelength filters on the basis of the structure of the image obtained by image capture of the photographic subject. The filter control unit 214 may control the transmission wavelengths of the variable wavelength filters on the basis of information related to characteristics of the photographic subject image, such as the texture of the image, the edges included in the image, periodic patterns in the pixel signals or in the image data, or the like. In this case, the analysis unit 22 analyzes the pixel signals for the pixels or the image data, and generates information related to characteristics of the photographic subject image. And the filter control unit 214 changes the resolution of the image sensor 4 by controlling the transmission wavelengths of the variable wavelength filters on the basis of this information related to characteristics of the photographic subject image generated by the analysis unit 22.

If the first photographic mode is set by the photographic mode setting unit 211, then the first image data generation unit 215 performs image processing of various types upon the pixel signals outputted from the image sensor 4, and generates image data for display. And the display unit 24 displays an image based upon this image data for display that has thus been generated by the first image data generation unit 215.

And, if the second photographic mode is set by the photographic mode setting unit 211, then the second image data generation unit 216 performs image processing of various types upon the pixel signals outputted from the image sensor 4, and generates image data for recording. And the second image data generation unit 216 records this image data for recording that has thus been generated in the memory 23. The image processing performed by the first image data generation unit 215 and the image processing performed by the second image data generation unit 216 may, for example, include per se known image processing such as tone conversion processing, edge enhancement processing, and so on. It should be understood that it would also be acceptable for the first image data generation unit 215 and the second image data generation unit 216 to be built in one unit as an image data generation unit that generates either image data for display or image data for recording.

Figure 2:
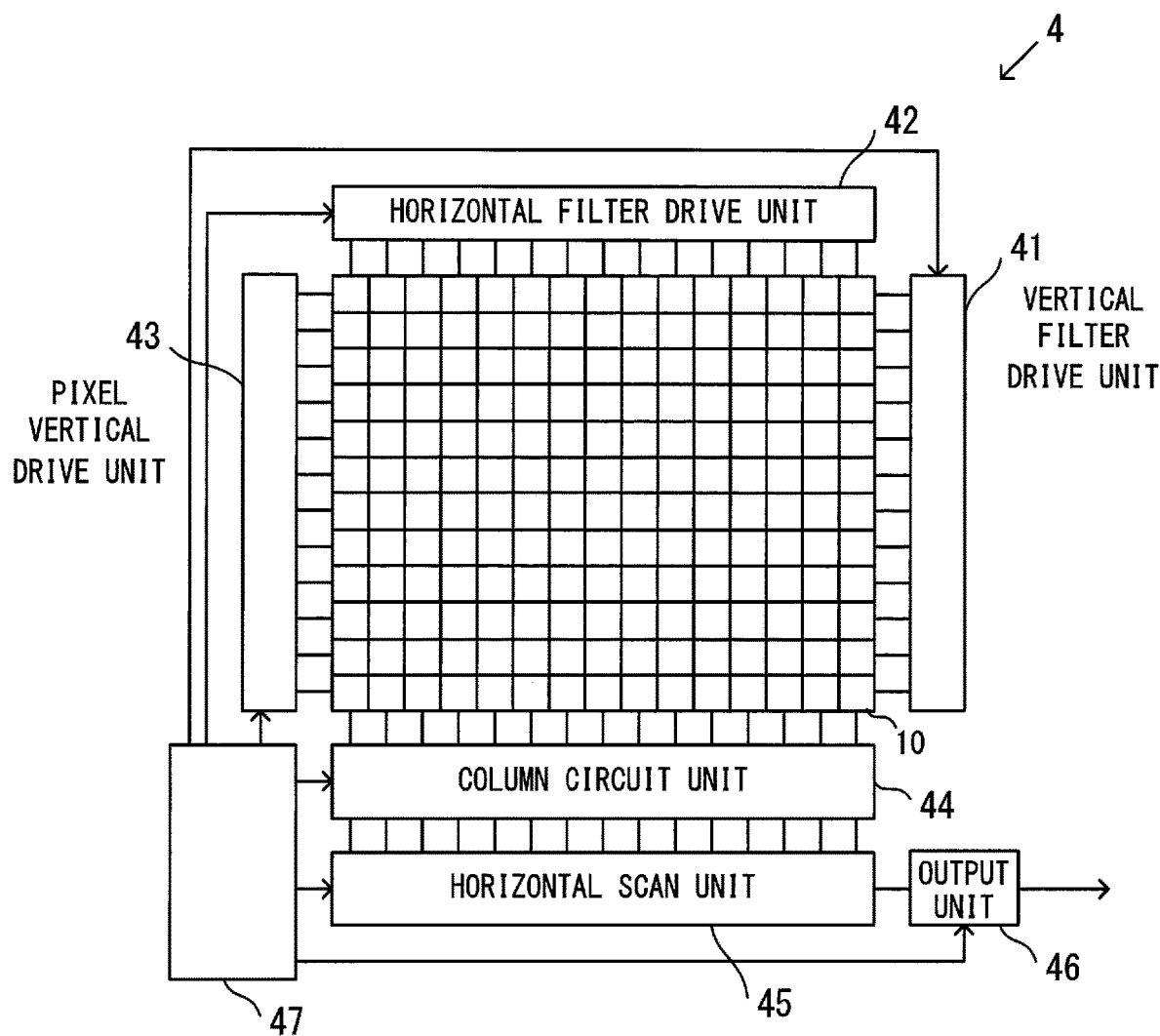
FIG. 2 is a block diagram showing a portion of the structure of an image sensor according to the first embodiment.
Figure 3:
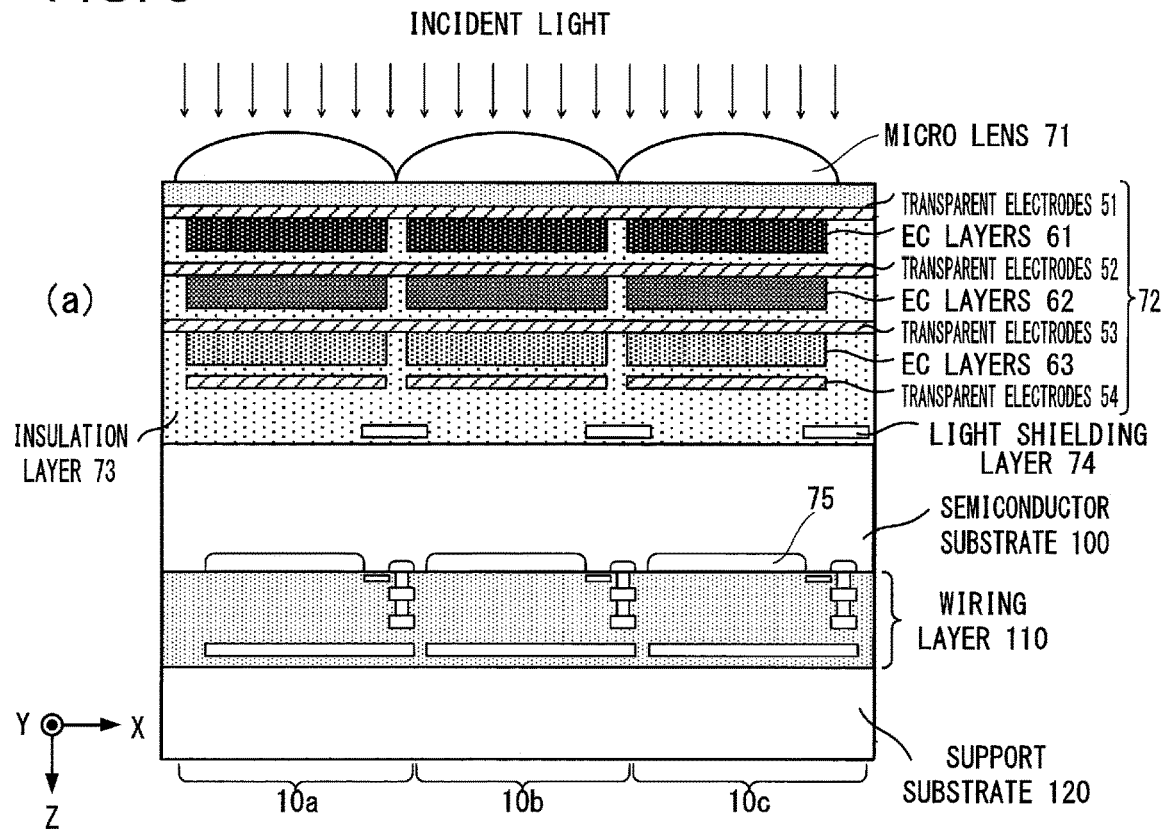
FIG. 3 is a figure for explanation of the structure of this image sensor according to the first embodiment.
Figure 3:
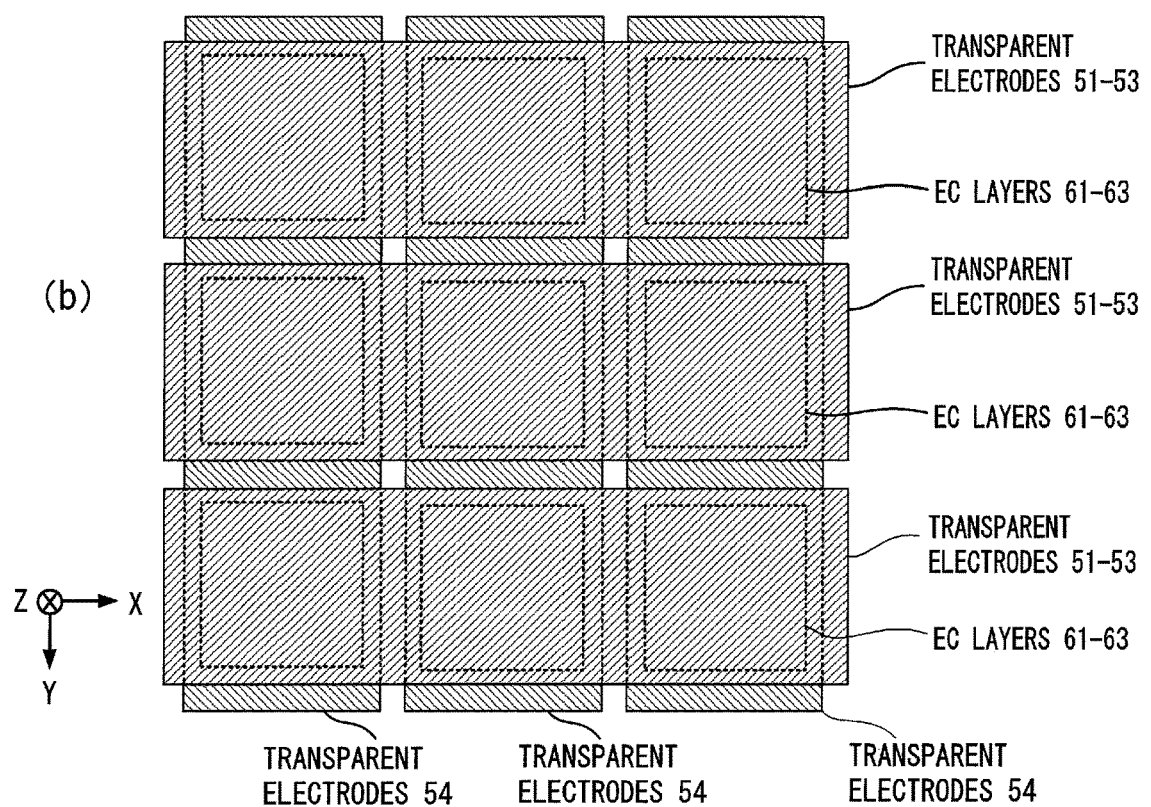

The structure of the image sensor 4 according to the first embodiment will now be explained with reference to FIGS. 2 and 3. FIG. 2 is a block diagram showing a portion of the structure of the image sensor 4 according to the first embodiment. And FIG. 3 is a figure for explanation of the structure of this image sensor 4 according to the first embodiment. FIG. 3(*a*) is a sectional view showing an example of the cross-sectional structure of the image sensor 4, and FIG. 3(*b*) is a plan view for explanation of an example of the layout of transparent electrodes of variable wavelength filters 72 of this image sensor 4.

As shown in FIG. 2, the image sensor 4 includes a plurality of pixels 10, a vertical filter drive unit 41, a horizontal filter drive unit 42, a pixel vertical drive unit 43, a column circuit 44, a horizontal scan unit 45, an output unit 46, and a control unit 47. In this image sensor 4, the pixels 10 are disposed in a two dimensional array (for example along a row direction and along a column direction that intersects that row direction). In the example shown in FIG. 2, in order to simplify the explanation, only fifteen pixels 10 in the horizontal direction by twelve pixels 10 in the vertical direction are shown, but actually the image sensor 4 has, for example, several million to several hundred million pixels or more.

As shown in FIG. 3(*a*), the image sensor 4 includes a semiconductor substrate 100, a wiring layer 110, a support substrate 120, micro lenses 71, and variable wavelength filters 72. In the example shown in FIG. 3(*a*), the image sensor 4 is built as a back side illuminated type image sensor. The semiconductor substrate 100 is laminated to the support substrate 120 via the wiring layer 110. The semiconductor substrate 100 is made of a semiconductor substrate material such as silicon or the like, and the support substrate 120 is made from a semiconductor substrate material or a glass substrate material or the like. The wiring layer 110 is a wiring layer that includes a conductor layer (a metallic layer) and an insulation layer, and includes a plurality of wires and vias and so on. Copper, aluminum, or the like is employed for the conductor layer. And the insulation layer is made from an oxide layer or a nitride layer or the like. As described above, the light that passes through the imaging optical system 31 is principally incident along the +Z axis direction.

Each of the pixels 10 (i.e. the pixels 10*a* through 10*c* in FIG. 3) includes a micro lens 71, a variable wavelength filter 72, a light shielding layer 74, and a photoelectric conversion unit 75. The micro lens 71 condenses the incident light upon the photoelectric conversion unit 75. The light shielding layer 74 is disposed at a boundary between adjacent pixels, and suppresses leakage of light between adjacent pixels. And the photoelectric conversion unit 75 photoelectrically converts incident light and generates electric charge.

The variable wavelength filter 72 includes electrochromic layers (hereinafter termed "EC layers") 61, 62, and 63 that are laminated together in that order from the side of the micro lens 71 to the side of the semiconductor substrate 100, and transparent electrodes 51, 52, 53, and 54. The EC layers 61 through 63 are made by employing electrochromic materials such as metallic oxides or the like. And the transparent electrodes 51 through 54 are, for example, made from ITO (indium tin oxide) or the like. Insulating films 73 are provided between the EC layer 61 and the transparent electrode 52, between the EC layer 62 and the transparent electrode 53, and between the EC 63 layer and the transparent electrode 54. Moreover, an electrolytic material layer (i.e. an electrolyte film) not shown in the figures is provided to this variable wavelength filter 72.

As clearly shown in FIG. 3(*b*), for each of the plurality of EC layers, the transparent electrodes 51 are disposed along the X direction, in other words along the row direction, so as to cover the one surfaces of the plurality of EC layers 61 that are disposed along the row direction. In the example shown in FIG. 2, since there are twelve rows in the array of pixels 10, accordingly twelve of the transparent electrodes 51 are disposed side by side. And, in a similar manner to the case with the transparent electrodes 51, the transparent electrodes 52 and the transparent electrodes 53 are disposed along the X direction so as to cover the one surfaces of the plurality of EC layers 62 and the plurality of EC layers 63.

The transparent electrodes 54 are electrodes that are common to the three EC layers 61, 62, and 63, and are disposed on the surfaces of the EC layers 63 on the other side. As clearly shown in FIG. 3(*b*), along each of the plurality of EC layers 63 that are disposed along the Y direction which intersects the X direction, in other words along the column direction, the common transparent electrodes 54 are disposed along the column direction. In the example shown in FIG. 2, since there are fifteen columns in the array of pixels 10, accordingly fifteen of the common transparent electrodes 54 are disposed side by side.

The transparent electrodes 51 through 53 and the common transparent electrodes 54 are electrodes that are disposed in the form of a matrix (i.e. a mesh) with respect to the EC layers 61, 62, and 63. The transparent electrodes 51 through 53 are connected to the vertical filter drive unit 41, and the common transparent electrodes 54 are connected to the horizontal filter drive unit 42. Due to this, in this embodiment, it is possible to perform active matrix driving, in which drive control of the EC layers 61, 62, and 63 is performed by employing the above electrodes in matrix form.

Upon supply of a drive signal to the transparent electrode 51 and to the common transparent electrode 54, the EC layer 61 develops B (blue) color by generating an oxidation-reduction reaction. Accordingly, upon supply of such a drive signal, among the incident light, the EC layer 61 transmits light of the wavelength region corresponding to B (blue). Moreover, upon supply of a drive signal to the transparent electrode 52 and to the common transparent electrode 54, the EC layer 62 develops G (green) color by generating an oxidation-reduction reaction. Accordingly, upon supply of such a drive signal, among the incident light, the EC layer 62 transmits light of the wavelength region corresponding to G (green). Moreover, upon supply of a drive signal to the transparent electrode 53 and to the common transparent electrode 54, the EC layer 63 develops R (red) color by generating an oxidation-reduction reaction. Accordingly, upon supply of such a drive signal, among the incident light, the EC layer 63 transmits light of the wavelength region corresponding to R (red). And when the supply of such drive signals is stopped, the EC layers 61, 62, 63 keep developing the colors described above over a certain time interval, and then, when a reset signal is supplied, they go into a state of transparency (i.e. a decolored state) in which, among the incident light, light of all wavelength regions is transmitted.

As described above, each of the plurality of variable wavelength filters 72 includes three filters: an EC layer 61 that develops B (blue) color, an EC layer 62 that develops G (green) color, and an EC layer 63 that develops R (red) color. In the state in which no drive signal is being supplied to any of the three EC layers 61, 62, and 63, the transmission wavelength region of the three EC layers is W (white). But when drive signals are being supplied to all of the three EC layers 61, 62, and 63, then the transmission wavelength region of the three EC layers together becomes BK (black). In a similar manner, when a drive signal is supplied only to the EC layer 61, or only to the EC layer 62, or only to the EC layer 63, then the transmission wavelength region of the three EC layers together becomes B (blue), or G (green), or R (red), respectively.

Due to this, by combining the transmission wavelengths of the EC layers 61 through 63, it becomes possible for the variable wavelength filter 72 principally to pass light in any of the W (white), BK (black), R (red), G (green), or B (blue) wavelength regions.

In the following explanation, a pixel for which the three-layer EC transmission wavelength region of the variable wavelength filter 72 is B (blue) will be termed a "B pixel", a pixel for which the three-layer EC transmission wavelength region is G (green) will be termed a "G pixel", and a pixel for which the three-layer EC transmission wavelength region is R (red) will be termed an "R pixel". In other words, a pixel in which the variable wavelength filter 72 is being controlled to be a B (blue) color filter will be termed a "B pixel", and, in a similar manner, a pixel in which the variable wavelength filter 72 is being controlled to be a G (green) color filter will be termed a "G pixel", and a pixel in which the variable wavelength filter 72 is being controlled to be a R (red) color filter will be termed an "R pixel". In this manner, in each of the pixels 10, the wavelength transmitted through the variable wavelength filter 72 is changed over as appropriate, and the optical component at this wavelength is photoelectrically converted. The photoelectric conversion unit 75 of each of the pixels 10 photoelectrically converts the light that has passed through its variable wavelength filter 72. The photoelectric conversion unit 75 is also a light reception unit 75 that receives the light from the photographic subject that has passed through the variable wavelength filter 72, and the photoelectric conversion unit 75 (i.e. the light reception unit 75) photoelectrically converts this incident light and generates a signal (i.e. generates electric charge).

In FIG. 2, the vertical filter drive unit 41 selects a plurality of rows of the variable wavelength filters 72, in other words selects one or more predetermined transparent electrodes among the plurality of transparent electrodes 51 through 53, and supplies a drive signal or signals thereto. And the horizontal filter drive unit 42 selects a plurality of columns of the variable wavelength filters 72, in other words selects one or more predetermined transparent electrodes among the plurality of common transparent electrodes 54, and supplies a drive signal or signals thereto. In this manner, the EC layers develop colors related both to the transparent electrodes 51 through 53 selected by the vertical filter drive unit 41 and to the common transparent electrodes 54 selected by the horizontal filter drive unit 42.

As an example, in FIG. 3(b), if the horizontal filter drive unit 42 selects the common transparent electrode 54 on the right edge from among the three common transparent electrodes 54 and supplies a drive signal thereto, and furthermore the vertical filter drive unit 41 selects the transparent electrode 51 on the upper edge in FIG. 3(b) from among the nine transparent electrodes 51 through 53 and supplies a drive signal thereto, then the EC layer 61 positioned at the upper right corner becomes colored. Moreover, if the horizontal filter drive unit 42 selects the same common transparent electrode 54 and supplies a drive signal thereto, and furthermore the vertical filter drive unit 41 selects the transparent electrode 52 on the upper edge in FIG. 3(b) and supplies a drive signal thereto, then the EC layer 62 positioned at the upper right corner becomes colored. Yet further, if the horizontal filter drive unit 42 selects the same common transparent electrode 54 and supplies a drive signal thereto, and furthermore the vertical filter drive unit 41 selects the transparent electrode 53 on the upper edge in FIG. 3(b) and supplies a drive signal thereto, then the EC layer 63 positioned at the upper right corner becomes colored.

In FIG. 2, the control unit 47 controls the vertical filter drive unit 41, the horizontal filter drive unit 42, the pixel vertical drive unit 43, the column circuit unit 44, the horizontal scan unit 45, and the output unit 46 on the basis of signals from the body control unit 21 of the camera 1. For example, the control unit 47 may control the vertical filter drive unit 41 and the horizontal filter drive unit 42 according to commands from the filter control unit 214 of the body control unit 21. The control unit 47 sets (i.e. changes) the transmission wavelengths of the variable wavelength filters 72 by controlling the signals inputted to the variable wavelength filters 72 from the vertical filter drive unit 41 and from the horizontal filter drive unit 42. And the pixel vertical drive unit 43 supplies control signals to the pixels 10 on the basis of signals from the control unit 47, thus controlling the operation of the pixels 10.

The column circuit unit 44 includes a plurality of analog/digital conversion units (A/D conversion units), and converts the pixel signals inputted from the pixels 10 via the vertical signal lines into digital signals and outputs these digital signals after conversion to the horizontal scan unit 45. And the horizontal scan unit 45 outputs the pixel signals that have been outputted from the column circuit unit 44 sequentially to the output unit 46. The output unit 46 includes a signal processing unit not shown in the figures which performs signal processing such as correlated double sampling and signal amount correction processing and so on upon the signals inputted from the horizontal scan unit 45, and outputs the result to the body control unit 21 of the camera 1. The output unit 46 includes input and output circuits corresponding to high speed interfaces such as LVDS and SLVS and so on, and transmits the above signals to the body control unit 21 at high speed.

As described above, the camera 1 according to this embodiment detects the spatial frequency components of the subject image on the basis of the pixel signals from the pixels, outputted from the image sensor 4. Then, the camera 1 controls the variable wavelength filters 72 on the basis of these spatial frequency components, and changes the resolution of the image sensor 4 by changing over the pixel color arrangement. In concrete terms, the filter control unit 214 changes over the control mode, and, for example, changes over between the pixel color arrangement in FIG. 4(a), and the pixel color arrangement in FIG. 5(a), and the pixel color arrangement in FIG. 6(a).

The filter control unit 214 has first, second, and third filter control modes. As described subsequently in detail, the filter control unit 214 arranges R pixels, G pixels, and B pixels in the color arrangement of FIG. 4(a) in the first filter control mode, arranges R pixels, G pixels, and B pixels in the color arrangement of FIG. 5(a) in the second filter control mode, and arranges R pixels, G pixels, and B pixels in the color arrangement of FIG. 6(a) in the third filter control mode. In other words, the filter control unit 214 controls the positions of the R pixels, of the G pixels, and of the B pixels. Although the details will be described hereinafter, with the pixel color arrangement shown in FIG. 4(a), a good balance of resolutions between the horizontal direction and the vertical direction is obtained. Moreover, with the pixel color arrangement shown in FIG. 5(a), a higher resolution in the horizontal direction is obtained; and, with the pixel color arrangement shown in FIG. 6(a), a higher resolution in the vertical direction is obtained. The filter control unit 214 selects one of the first, the second, and the third filter control modes on the basis of the spatial frequency components of the subject image, and then changes over the pixel color arrangement so as to obtain resolutions that are appropriate for the subject to be photographed.

For example, the filter control unit 214 executes the first filter control mode when a subject image is captured in which the high frequency components of the special frequency in each of the horizontal direction and the vertical direction are almost equal, and in this case may establish the pixel color arrangement of FIG. 4(a), with which a good balance is obtained between the resolution in the horizontal direction and the resolution in the vertical direction. And, for example, when a subject image is captured in which the high frequency component of the special frequency in the horizontal direction is greater than the high frequency component of the special frequency in the vertical direction by at least a predetermined amount, then the filter control unit 214 may execute the second filter control mode in which it establishes the pixel color arrangement of FIG. 5(a), with which a higher resolution is obtained in the horizontal direction. Furthermore, for example, when a subject image is captured in which the high frequency component of the special frequency in the vertical direction is greater than the high frequency component of the special frequency in the horizontal direction by at least a predetermined amount, then the filter control unit 214 may execute the third filter control mode in which it establishes the pixel color arrangement of FIG. 6(a), with which a higher resolution is obtained in the vertical direction. In the following, the details of the color arrangements of the pixels for each of the control modes of the filter control unit 214 will be explained in detail.

FIG. 4(a) is a figure showing the color arrangement of the R pixels, the G pixels, and the B pixels in the first filter control mode of the filter control unit 214, and FIG. 4(b) is a figure showing the spatial frequency range that can be resolved in the case of the color arrangement shown in FIG. 4(a). In FIG. 4(a), as described above, the R pixels 10 are pixels 10 in which the variable wavelength filters 72 are controlled to be R (red) filters. Moreover, the G pixels 10 are pixels 10 in which the variable wavelength filters 72 are controlled to be G (green) filters, and the B pixels 10 are pixels 10 in which the variable wavelength filters 72 are controlled to be B (blue) filters.

In FIG. 4(a), the control unit 47 controls the variable wavelength filters 72 according to commands from the filter control unit 214 of the body control unit 21, and sets up an arrangement of R pixels 10, G pixels 10, and B pixels 10 according to a Bayer array. Pixel columns in which R pixels 10 and G pixels 10 are disposed alternatingly along the row direction at a pitch d, in other words with gaps d between them, and pixel columns in which G pixels 10 and B pixels 10 are disposed alternatingly along the row direction at the pitch d, in other words with gaps d between them, are set up alternatingly along the column direction. In a Bayer array, the gaps (2d) between R pixels in the horizontal direction (i.e. the row direction) and the gaps (2d) between R pixels in the vertical direction (i.e. the column direction) are the same. In a similar manner, the gaps (2d) between G pixels in the horizontal direction (i.e. the row direction) and the gaps (2d) between G pixels in the vertical direction (i.e. the column direction) are the same, and the gaps (2d) between B pixels in the horizontal direction (i.e. the row direction) and the gaps (2d) between B pixels in the vertical direction (i.e. the column direction) are the same.

FIG. 4(b) shows the spatial frequency ranges that can be resolved in the case of the Bayer array of FIG. 4(a). In FIG. 4(b), the vertical axis fy displays spatial frequency in the vertical direction, and the horizontal axis fx displays spatial frequency in the horizontal direction. In FIG. 4(b), the spatial frequency ranges of the G pixels 10 that can be resolved are shown by the solid line, and the spatial frequency ranges of the R pixels 10 and of the B pixels 10 that can be resolved are shown by the dotted line. In this manner, with a Bayer array, the spatial frequency ranges of the G pixels 10 that can be resolved are the same in the horizontal direction and in the vertical direction, and moreover the spatial frequency ranges of the R pixels 10 and of the B pixels 10 that can be resolved are the same in the horizontal direction and in the vertical direction.

A Bayer array of R pixels, G pixels, and B pixels of this type as shown in FIG. 4(a) is employed during the second photographic mode in which image data for recording is generated and this image data is recorded in the memory 23, when the third spatial frequency characteristic has been detected by the frequency characteristic detection unit 213. Moreover, the Bayer array of FIG. 4(a) is employed, without any relationship to the spatial frequency characteristics of the subject image, during the first photographic mode in which a through image, in other words image data for display, is being generated and is being displayed upon the display unit 24.

FIG. 5(a) is a figure showing the arrangement of the colors of the R pixels, the G pixels, and the B pixels in the second filter control mode of the filter control unit 214, in which layout of pixels of the same color along the horizontal direction is emphasized. And FIG. 5(b) shows the spatial frequency ranges that can be resolved in the case of the color arrangement of FIG. 5(a).

In FIG. 5(a), pixel columns in which R pixels 10 are disposed sequentially in the row direction at the pitch d, pixel columns in which G pixels 10 are disposed sequentially in the row direction at the pitch d, and pixel columns in which B pixels 10 are disposed sequentially in the row direction at the pitch d are established repeatedly in turn along the column direction. Accordingly, the R pixels 10 are disposed at intervals 3d in the column direction, and similarly the G pixels 10 are disposed at intervals 3d in the column direction and the R pixels 10 are disposed at intervals 3d in the column direction. This type of pixel color arrangement, in which layout of the R pixels, of the G pixels, and of the B pixels along the horizontal direction is emphasized, is achieved by the control unit 47 controlling the variable wavelength filters 72 according to commands from the filter control unit 214 of the body control unit 21.

Since, as described above, the R pixels are disposed at the pitch d in the row direction and are disposed at the pitch 3d in the column direction, and similarly for the G pixels and for the B pixels, accordingly, as shown in FIG. 5(b), the spatial frequency ranges of the R pixels, of the G pixels, and of the B pixels that can be resolved with this type of pixel color arrangement have resolutions in the horizontal direction (i.e. the row direction) that are higher than the resolutions in the vertical direction (i.e. in the column direction).

This type of arrangement shown in FIG. 5(a) of the colors of the pixels, in which layout of the R pixels, of the G pixels, and of the B pixels along the horizontal direction is emphasized, is employed during the second photographic mode, when the first spatial frequency characteristic has been detected by the frequency characteristic detection unit 213.

FIG. 6(a) is a figure showing the arrangement of the colors of the R pixels, G pixels, and B pixels in the third filter control mode of the filter control unit 214, in which layout of pixels of the same color along the vertical direction is emphasized. And FIG. 6(b) shows the spatial frequency ranges that can be resolved in the case of the color arrangement of FIG. 6(a).

In FIG. 6(a), pixel columns in which R pixels 10 are disposed sequentially in the column direction at the pitch d, pixel columns in which G pixels 10 are disposed sequentially in the column direction at the pitch d, and pixel columns in which B pixels 10 are disposed sequentially in the column direction at the pitch d are set up repeatedly in turn along the row direction. Accordingly, the R pixels 10 are disposed at intervals 3d in the row direction (i.e. along the horizontal direction), and similarly the G pixels 10 are disposed at intervals 3d in the row direction and the R pixels 10 are disposed at intervals 3d in the row direction. This type of pixel color arrangement, in which layout of the R pixels, of the G pixels, and of the B pixels along the vertical direction is emphasized, is achieved by the control unit 47 controlling the variable wavelength filters 72 according to commands from the filter control unit 214 of the body control unit 21.

Since, as described above, the R pixels are disposed at the pitch d in the column direction and are disposed at the pitch 3d in the row direction, and similarly for the G pixels and for the B pixels, accordingly, as shown in FIG. 6(b), the spatial frequency ranges of the R pixels, of the G pixels, and the B pixels that can be resolved with this type of pixel color arrangement have resolutions in the vertical direction (i.e. the column direction) that are higher than the resolutions in the horizontal direction (i.e. in the row direction).

This type of arrangement shown in FIG. 6(a) of the colors of the pixels, in which layout of the R pixels, of the G pixels, and of the B pixels along the vertical direction is emphasized, is employed during the second photographic mode, when the second spatial frequency characteristic has been detected by the frequency characteristic detection unit 213.

The frequency characteristic detection unit 213 described above calculates the high frequency components of the spatial frequency for each color component of the subject image. In concrete terms, on the basis of the pixel signals from the R, G, and B pixels outputted from the image sensor 4, in other words on the basis of the pixel signals for the R component, the G component, and the B component, the frequency characteristic detection unit 213 calculates the high frequency components in the horizontal direction and the high frequency components in the vertical direction related to each of the R color, the G color, and the B color. In the case of the Bayer array shown in FIG. 4(a), the image sensor 4 generates a pixel signal for the R component at every interval of 2d in the horizontal direction, a pixel signal for the G component at every interval of 2d in the horizontal direction, and a pixel signal for the B component at every interval of 2d in the horizontal direction. Moreover, the image sensor 4 generates a pixel signal for the R component at every interval of 2d in the vertical direction, a pixel signal for the G component at every interval of 2d in the vertical direction, and a pixel signal for the B component at every interval of 2d in the vertical direction.

The frequency characteristic detection unit 213 performs high speed Fourier transform processing upon the pixel signals for the R component at every interval of 2d in the horizontal direction, and thereby calculates high frequency components (a signal component of spatial frequency 1/2d and so on) for the R component in the horizontal direction. In a similar manner, the frequency characteristic detection unit 213 performs high speed Fourier transform processing upon the pixel signals for the B component at every interval of 2d in the horizontal direction, and thereby calculates high frequency components (a signal component of spatial frequency 1/2d and so on) for the B component in the horizontal direction.

Furthermore, the frequency characteristic detection unit 213 performs high speed Fourier transform processing upon the pixel signals for the R component at every interval of 2d in the vertical direction, and thereby calculates high frequency components (a signal component of spatial frequency 1/2d and so on) for the R component in the vertical direction. In a similar manner, the frequency characteristic detection unit 213 performs high speed Fourier transform processing upon the pixel signals for the B component at every interval of 2d in the vertical direction, and thereby calculates high frequency components (a signal component of spatial frequency 1/2d and so on) for the B component in the vertical direction.

When calculating the high frequency components for the G component, the frequency characteristic detection unit 213 generates pixel signals for the G component at the positions of R pixels 10 or B pixels 10 that are positioned between adjacent G pixels by performing interpolation processing upon the pixel signals for the G component. In other words, by performing interpolation processing, the frequency characteristic detection unit 213 acquires pixel signals for the G component at every interval of d in the horizontal direction, and also acquires pixel signals for the G component at every interval of d in the vertical direction.

The interpolation processing for the G component in the horizontal direction will now be explained in the following. For the pixel columns in FIG. 4(a) in which R pixels and G pixels are disposed alternatingly in the horizontal direction, the frequency characteristic detection unit 213 interpolates the pixel signal for the G component corresponding to the position of an R pixel by employing the pixel signals from the two G pixels that are positioned above and below that R pixel. In a similar manner, for the pixel columns in which G pixels and B pixels are disposed alternatingly in the horizontal direction, the pixel signal for the G component corresponding to the position of a B pixel is interpolated by employing the pixel signals from the two G pixels that are positioned above and below that B pixel.

The interpolation processing for the G component in the vertical direction will now be explained in the following. For the pixel columns in FIG. 4(a) in which R pixels and G pixels are disposed alternatingly in the vertical direction, the frequency characteristic detection unit 213 interpolates the pixel signal for the G component corresponding to the position of an R pixel by employing the pixel signals from the two G pixels that are positioned to the left and to the right of that R pixel. In a similar manner, for the pixel columns in which G pixels and B pixels are disposed alternatingly in the vertical direction, the pixel signal for the G component corresponding to the position of a B pixel is interpolated by employing the pixel signals from the two G pixels that are positioned to the left and to the right of that B pixel. It should be understood that, when calculating the pixel signals for the G component in this interpolation processing, it would also be possible to perform the calculation by averaging the pixel signals from two pixels, or by calculating a weighted average of the pixel signals from two pixels.

By performing the interpolation processing described above, the frequency characteristic detection unit 213 acquires pixel signals for the G component at every interval of d in the horizontal direction, and also acquires pixel signals for the G component at every interval of d in the vertical direction. And the frequency characteristic detection unit 213 performs high speed Fourier transform processing upon these pixel signals for the G component at every interval of d in the horizontal direction, and thereby calculates high frequency components (a signal component of spatial frequency $1/d$ and so on) for the G component in the horizontal direction. Furthermore, the frequency characteristic detection unit 213 performs high speed Fourier transform processing upon the pixel signals for the G component at every interval of d in the vertical direction, and thereby calculates high frequency components (a signal component of spatial frequency $1/d$ and so on) for the G component in the vertical direction.

In this manner, the frequency characteristic detection unit 213 calculates high frequency components for each color component in the horizontal direction and in the vertical direction. And the frequency characteristic detection unit 213 performs spatial frequency characteristic determination processing on the basis of these high frequency components that have thus been calculated. For example, the frequency characteristic detection unit 213 may add together the high frequency components in the horizontal direction related to the R component, to the G component, and to the B component to calculate the addition high frequency component in the horizontal direction, and, in a similar manner, may add together the high frequency components in the vertical direction related to the R component, to the G component, and to the B component to calculate the addition high frequency component in the vertical direction. And the frequency characteristic detection unit 213 may perform the spatial frequency characteristic determination processing by comparing together the addition high frequency component in the horizontal direction and the addition high frequency component in the vertical direction. It should be understood that, instead of calculating the high frequency component for each of the color components, it would also be acceptable to arrange to calculate the high frequency component by mixing together the three RGB color components.

It should be understood that it would also be acceptable to arrange for the frequency characteristic detection unit 213 to calculate the differences between the pixel signals from adjacent pixels that are disposed both in the row direction and in the column direction, to calculate the high frequency components for the spatial frequency in the horizontal direction and the vertical direction by integrating those differences, and thereby to calculate the high frequency components for each color component. In this case as well, when calculating the high frequency components for the G component, the pixel signals for the G component corresponding to the positions of R pixels or of B pixels between neighboring G pixels are calculated by interpolation, as described above.

The filter control unit 214 selects one of the first, second, and third filter control modes on the basis of the spatial frequency characteristics of the subject image, and changes over the pixel color arrangement to a Bayer array, or to an array in which the layout along the horizontal direction is emphasized, or to an array in which the layout along the vertical direction is emphasized.

Figure 4:
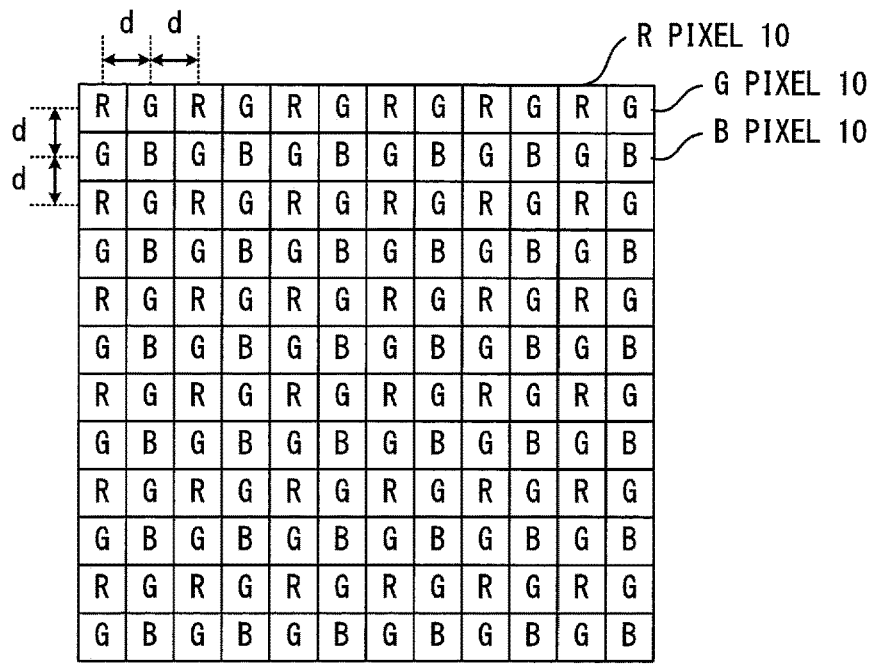
FIG. 4 is a figure showing a color filter arrangement and spatial frequency ranges due to variable wavelength filters of this image sensor according to the first embodiment.
Figure 4:
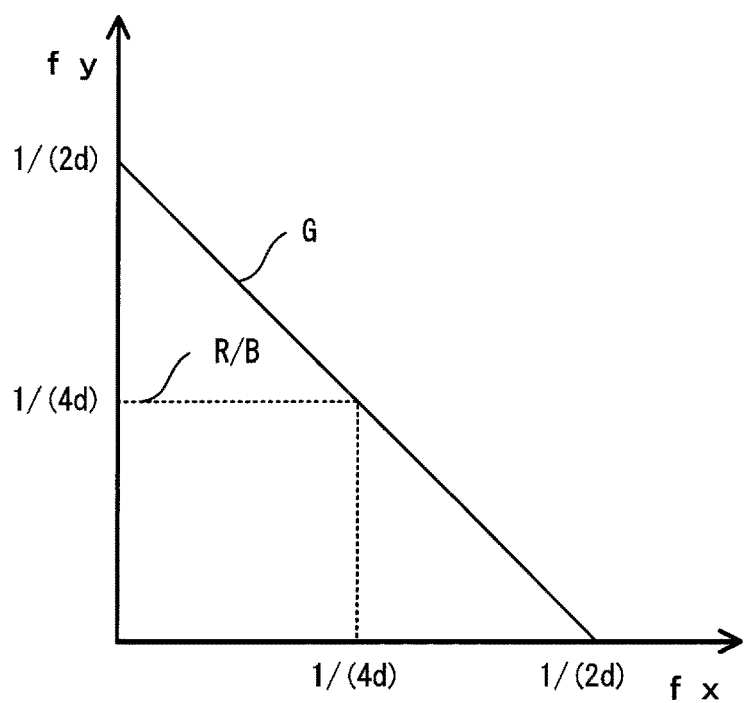
Figure 5:
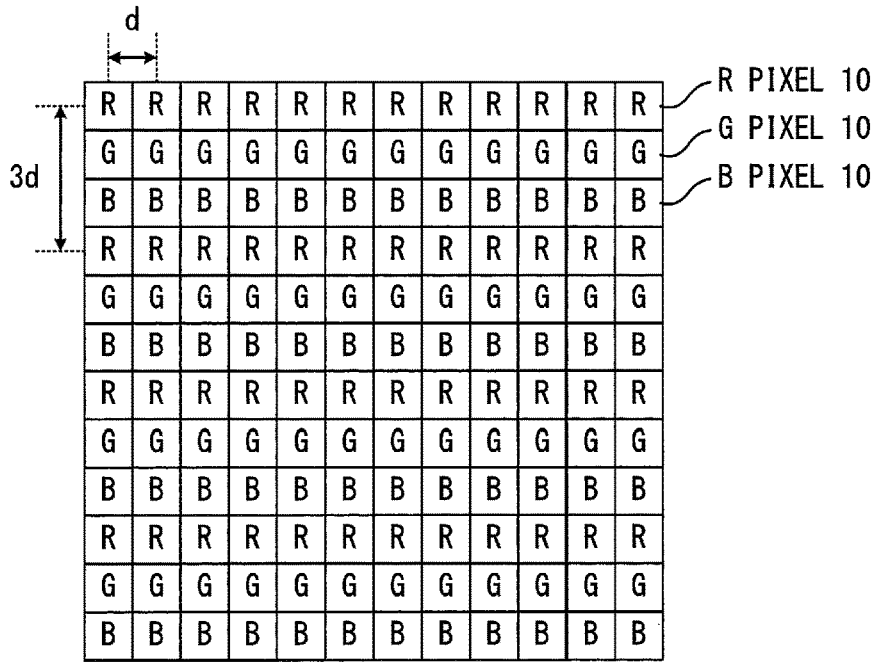
FIG. 5 is another figure showing a color filter arrangement and spatial frequency ranges due to variable wavelength filters of this image sensor according to the first embodiment.
Figure 5:
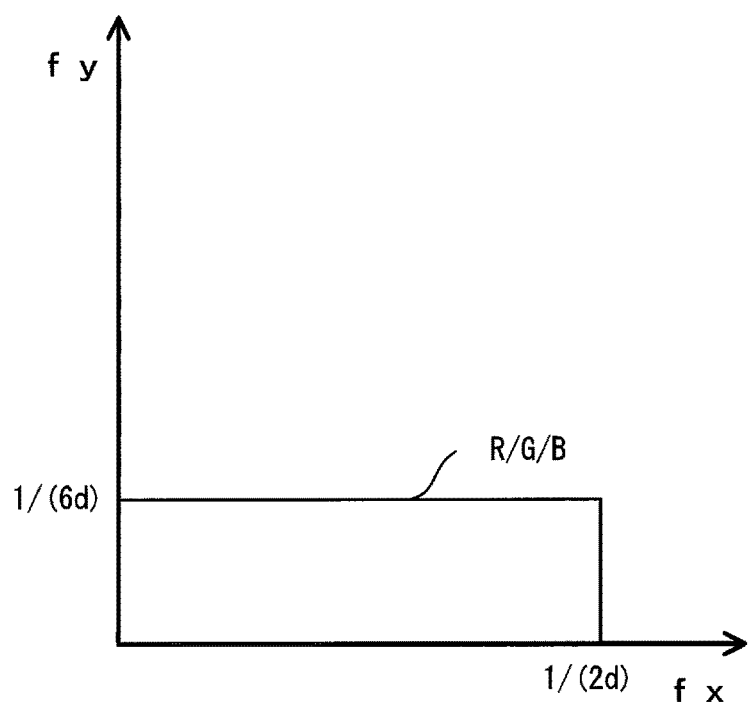
Figure 6:
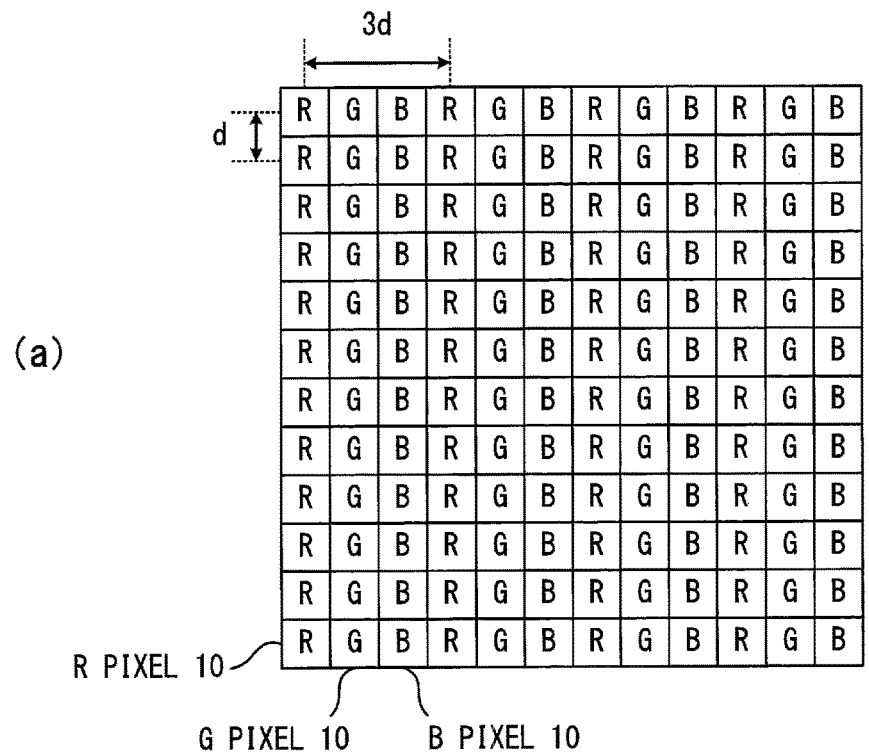
FIG. 6 is yet another figure showing a color filter arrangement and spatial frequency ranges due to variable wavelength filters of this image sensor according to the first embodiment.
Figure 6:
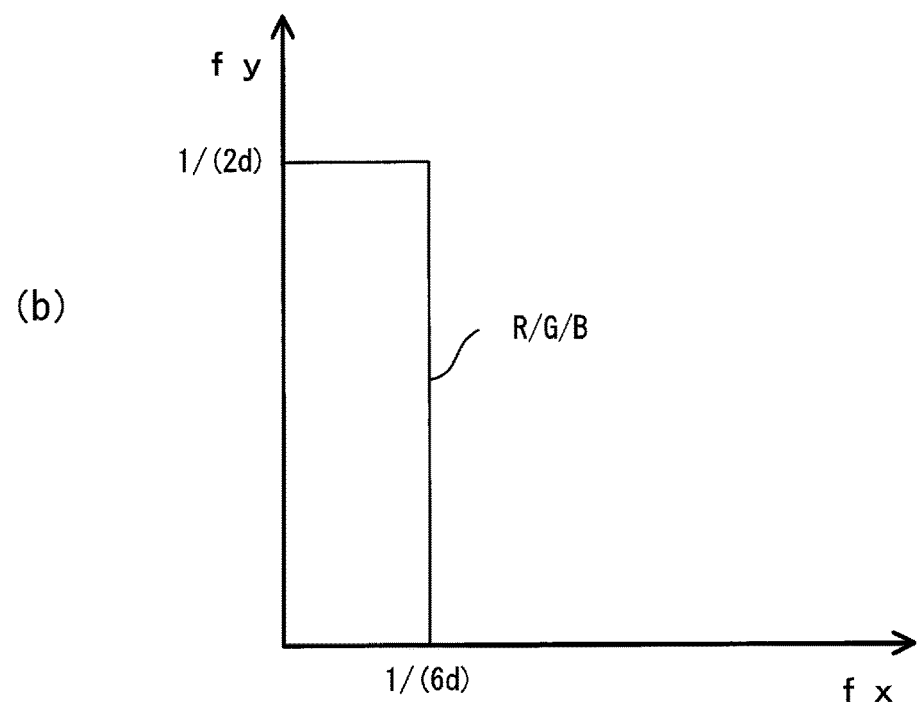

In this manner, in this embodiment, by controlling the variable wavelength filters 72 of the image sensor 4, the camera 1 is able to control the positions of the R pixels, the G pixels, and the B pixels, and thereby is able to change the resolutions in the horizontal direction and in the vertical direction. In other words, for example, the camera 1 is able to change over between having well balanced resolutions in the horizontal direction and in the vertical direction as shown in FIG. 4, and having higher resolution in the horizontal direction as shown in FIG. 5, and having higher resolution in the vertical direction as shown in FIG. 6.

Figure 7:
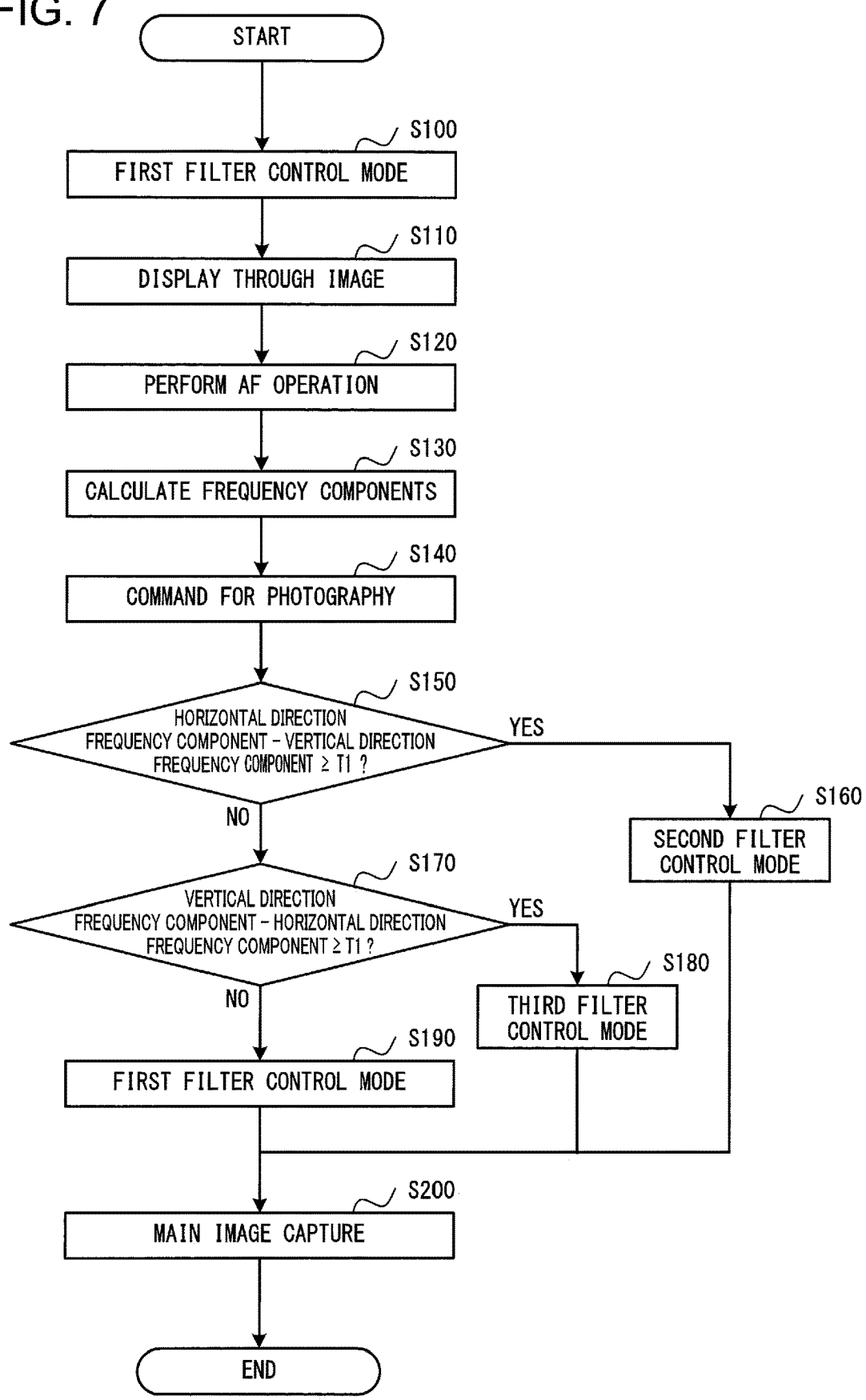
FIG. 7 is a flow chart showing an example of the operation of the imaging device according to the first embodiment.

FIG. 7 is a flow chart showing an example of the operation of this camera 1 according to the first embodiment. An example of the operation of the camera 1 will now be explained with reference to this flow chart of FIG. 7. The processing shown in FIG. 7 is started when, for example, the release button is half pressed by the user and the first photographic mode is set by the photographic mode setting unit 211.

In step S100, the filter control unit 214 executes the first filter control mode and controls the variable wavelength filters 72 of the pixels 10 via the control unit 47 of the image sensor 4, and thereby, as shown in FIG. 4(a), R pixels 10, G pixels 10, and B pixels 10 are disposed according to a Bayer array.

In step S110, the body control unit 21 causes the image sensor 4 to perform image capture. The image sensor 4 photoelectrically converts the light from the photographic subject, and outputs a pixel signal from each of the pixels 10 to the body control unit 21. The first image data generation unit 215 performs image processing upon the pixel signals outputted from the image sensor 4, and generates image data for display. And the display unit 24 displays a through image on the basis of this image data for display.

In step S120, on the basis of the pixel signals from the image sensor 4, the focus detection unit 212 sequentially calculates evaluated contrast values of the subject image. And the focus detection unit 212 generates a signal related to the position of the focus adjustment lens when the evaluated contrast value reaches its maximum value, and outputs this signal to the lens control unit 32. The lens control unit 32 then shifts the focus adjustment lens to its focused position, thus performing focus adjustment.

After the focus adjustment lens has been shifted to its focused position, in step S130, on the basis of the pixel signals outputted from the image sensor 4, the frequency characteristic detection unit 213 calculates both the high frequency components of the subject image in the horizontal direction and also the high frequency components of the subject image in the vertical direction. It should be understood that this calculation of the high frequency components in step S130 is not necessarily performed after the AF operation in step S120; this calculation could be performed before the AF operation or simultaneously with the AF operation, but is preferably performed after the AF operation, in order for the calculation of the high frequency components of the subject image to be performed in a focused state.

In step S140, the second photographic mode is established when the photographic mode setting unit 211 detects full press actuation of the release button by the user.

In step S150, the frequency characteristic detection unit 213 makes a decision as to whether or not the high frequency component of the spatial frequency of the subject image in the horizontal direction is greater than the high frequency component of the spatial frequency of the subject image in the vertical direction by at least the predetermined amount T1. If the high frequency component in the horizontal direction is greater than the high frequency component in the vertical direction by at least the predetermined amount T1, then the frequency characteristic detection unit 213 decides that the spatial frequency characteristic of the subject image is the first spatial frequency characteristic and the flow of control proceeds to step S160, whereas if a negative decision is reached in step S150 then the flow of control is transferred to step S170. In step S160, on the basis of detection of the first spatial frequency characteristic by the frequency characteristic detection unit 213, the filter control unit 214 executes the second filter control mode. In this second filter control mode, R pixels 10, G pixels 10, and B pixels 10 are disposed as shown in FIG. 5(a), and thereby the pixel color arrangement is changed over so that the resolution in the horizontal direction becomes higher (i.e., is changed over to a layout in which the horizontal direction is emphasized).

In step S170, the frequency characteristic detection unit 213 makes a decision as to whether or not the high frequency component of the spatial frequency of the subject image in the vertical direction is greater than the high frequency component of the spatial frequency of the subject image in the horizontal direction by at least the predetermined amount T1. If the high frequency component in the vertical direction is greater than the high frequency component in the horizontal direction by at least the predetermined amount T1, then the frequency characteristic detection unit 213 decides that the spatial frequency characteristic of the subject image is the second spatial frequency characteristic and the flow of control proceeds to step S180. In step S180, on the basis of detection of the second spatial frequency characteristic by the frequency characteristic detection unit 213, the filter control unit 214 executes the third filter control mode. In this third filter control mode, R pixels 10, G pixels 10, and B pixels 10 are disposed as shown in FIG. 6(a), and thereby the pixel color arrangement is changed over so that the resolution in the vertical direction becomes higher (i.e., is changed over to a layout in which the vertical direction is emphasized).

If a negative decision is reached in step S170, then the frequency characteristic detection unit 213 decides that the spatial frequency characteristic of the subject image is the third spatial frequency characteristic, in other words that the high frequency component in the horizontal direction and the high frequency component in the vertical direction are almost the same, and the flow of control is transferred to step S190. In this step S190, on the basis of detection of the third spatial frequency characteristic by the frequency characteristic detection unit 213, the filter control unit 214 executes the first filter control mode. According to this first filter control mode, R pixels 10, G pixels 10, and B pixels 10 are disposed according to a Bayer array, as shown in FIG. 4(a).

In step S200, the body control unit 21 causes the image sensor 4 to perform main image capture. The image sensor 4 outputs the pixel signals of the pixels 10 that have thus been generated to the body control unit 21. And the second image data generation unit 216 performs image processing upon the pixel signals thus outputted from the image sensor 4, and generates image data for recording. The memory 23 records this image data for recording. In this manner, on the basis of the spatial frequency characteristic of the subject image as detected by the frequency characteristic detection unit 213, the main image capture in step S200 is performed with the pixel color arrangement of FIG. 5(a), or of FIG. 6(a), or of FIG. 4(a).

According to the embodiment described above, the following beneficial operational effects are obtained.

(1) With the imaging device 1 according to this embodiment, the filter control unit 214 controls the transmission wavelengths of the variable wavelength filters 72 of the plurality of pixels 10 of the imaging unit 4 (i.e. of the image sensor 4), and thus controls the positions of the pixels, on the basis of the results of analysis of the subject image by the analysis unit 22. Due to this, it is possible to change the resolution of the image sensor 4 according to the photographic subject.

(2) With the imaging device 1 according to this embodiment, the control unit 21 controls the transmission wavelengths of the variable wavelength filters 72, and thus changes over the pixel color arrangement, on the basis of the pixel signals due to the electric charges generated by the light reception units 75 (i.e. the photoelectric conversion units 75). Due to this, it is possible to change the resolution of the image sensor 4 according to the photographic subject.

(3) With the imaging device 1 according to this embodiment, the frequency characteristic detection unit 213 detects first spatial frequency components and second spatial frequency components of the subject image, and the filter control unit 214 controls the variable wavelength filters 72 on the basis of these first spatial frequency components and second spatial frequency components. Due to this, it is possible to change over the pixel color arrangement on the basis of the spatial frequency components of the subject image. As a result, it is possible to change the resolution of the image sensor 4 according to the photographic subject.

Second Embodiment

Figure 8:
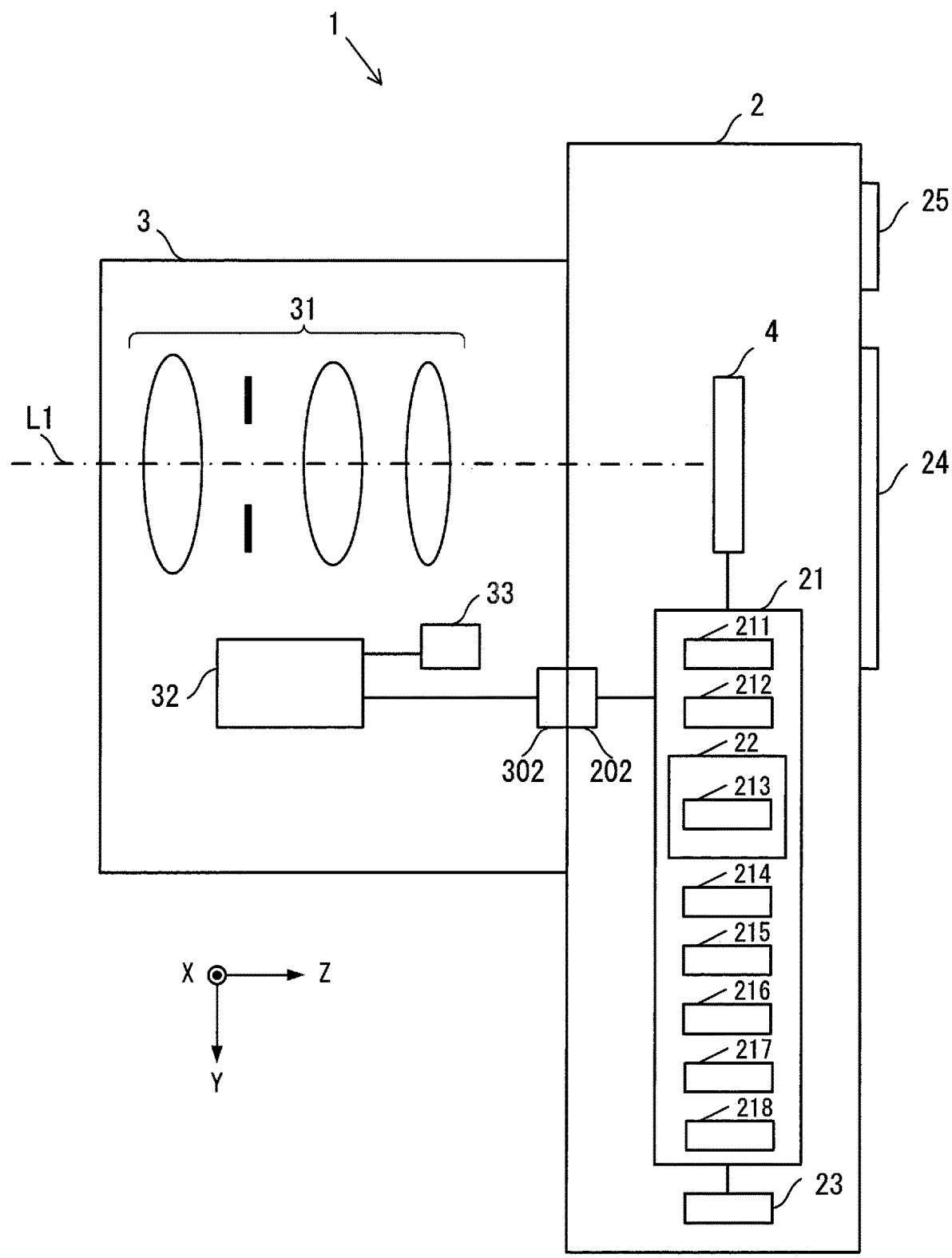
FIG. 8 is a block diagram showing the structure of an imaging device according to a second embodiment.

An imaging device according to a second embodiment will now be explained with reference to the drawings. With this imaging device according to the second embodiment, along with changing the sizes of the pixel blocks that are made up from pixels of the same color, also processing is performed to change the pixel color arrangement on the basis of the spatial frequency characteristics of the subject image. FIG. 8 is a figure showing an example of the structure of a camera 1 which is an example of an imaging device according to the second embodiment. It should be understood that, in this figure, the same reference numbers are appended to portions that are the same as or that correspond to portions of the first embodiment, and the explanation will principally focus upon the features of difference.

The body control unit 21 of the camera 1 includes an area change unit 217 and an addition control unit 218. The area change unit 217 is capable of changing the sizes of the pixel blocks by controlling the image sensor 4 so that the transmission wavelength regions of the variable wavelength filters 72 of a plurality of mutually adjacent pixels 10 become the same. In other words, the area change unit 217 is capable of changing the sizes of the pixel blocks so that they become 2×2 blocks of G pixels, or 4×4 blocks of G pixels, or 6×6 blocks of G pixels. In a similar manner, the area change unit 217 is capable of changing the sizes of the pixel blocks so that they become 2×2 blocks of R pixels or of B pixels, or 4×4 blocks of R pixels or of B pixels, or 6×6 blocks of R pixels or of B pixels.

Generally, when using image data photographed by the camera 1 and recorded in the memory 23 for reproduction upon an external display device, the number of pixels displayed upon the external display device and the number of pixels upon the image sensor 4 are almost equal, but in some cases the number of pixels displayed upon the external display device is fewer than the number of pixels upon the image sensor 4.

For example, when the number of pixels displayed upon the external display device that displays the image is almost equal to the number of pixels upon the image sensor 4, then the area change unit 217 may determine the size of the pixel blocks so that each pixel block consists of a single pixel 10. In other words, the first embodiment described above is an example of this case in which each pixel block consists of a single pixel.

Furthermore, when the number of pixels displayed upon the external display device that displays the image is fewer as compared to the number of pixels upon the image sensor 4, then the area change unit 217 may determine the size of the pixel blocks so that each pixel block consists of a plurality of pixels (2×2 pixels or the like).

The addition control unit 218 controls the operation of the image sensor 4 on the basis of the pixel blocks determined by the area change unit 217. If the pixel locks consist of a plurality of pixels, then the addition control unit 218 causes the image sensor 4 to perform addition processing for adding together the signals from the plurality of pixels that make up each pixel block. In concrete terms, for example, as such addition processing, the image sensor 4 performs processing to average the signals from the plurality of pixels 10 while controlling switches connected to the floating diffusions of each of the plurality of pixels 10 within the pixel block to ON and OFF. And the image sensor 4 generates pixel signals by adding together the signals of the plurality of pixels 10, and outputs them to the body control unit 21. It should be understood that, instead of this addition processing being performed internally to the image sensor 4, it would also be acceptable to arrange for the pixel signals to be outputted from the image sensor 4 and for the addition processing to be performed externally to the image sensor 4.

In the case of the first photographic mode, the first image data generation unit 215 performs image processing of various types upon the addition pixel signals resulting from addition of the signals from the plurality of pixels within each pixel block, and thereby generates the image data for display. And the display unit 24 displays an image on the basis of this image data for display generated by the first image data generation unit 215.

However, in the case of the second photographic mode, the second image data generation unit 216 performs image processing of various types upon the addition pixel signals resulting from addition of the signals from the plurality of pixels within each pixel block, and thereby generates the image data for recording. And the second image data generation unit 216 causes the memory 23 to record this image data for recording that has thus been generated.

In this embodiment, the filter control unit 214 changes over the color arrangement of the R pixel blocks, the G pixel blocks, and the B pixel blocks determined by the area change unit 217 on the basis of the filter control mode. In other words, in the first filter control mode, the filter control unit 214 arranges the R pixel blocks, the G pixel blocks, and the B pixel blocks in the Bayer array of FIG. 9(*a*), as will be described in detail hereinafter. In a similar manner, in the second filter control mode, the filter control unit 214 arranges the R pixel blocks, the G pixel blocks, and the B pixel blocks in the arrangement of FIG. 10(*a*) in which the layout along the horizontal direction is emphasized; and, in the third filter control mode, the filter control unit 214 arranges the R pixel blocks, the G pixel blocks, and the B pixel blocks in the arrangement of FIG. 11(*a*) in which the layout along the vertical direction is emphasized. Thus, the filter control unit 214 selects one of the first, second, and third filter control modes, and changes over the pixel color arrangement so that a resolution is obtained that is appropriate for the subject of photography. In the following, the details of the color arrangements of the pixels for the various control modes of the filter control unit 214 will be explained.

Figure 9:
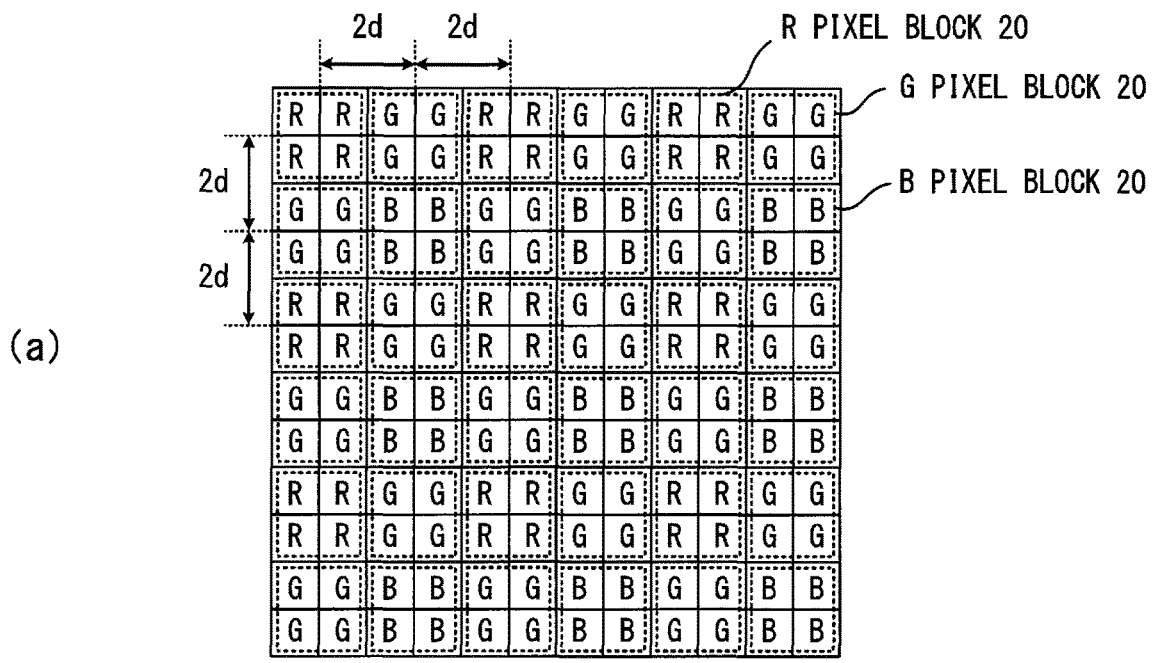
FIG. 9 is a figure showing a color filter arrangement and spatial frequency ranges due to variable wavelength filters of an image sensor according to this second embodiment.
Figure 9:
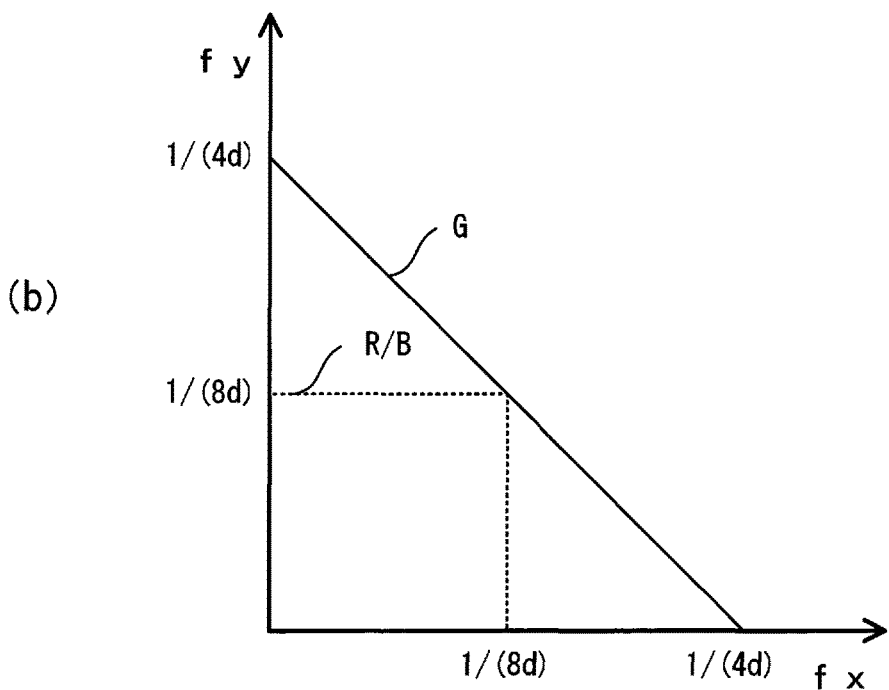

FIG. 9(*a*) is a figure showing the pixel color arrangement in the first filter control mode of the filter control unit 214, and FIG. 9(*b*) is a figure showing the spatial frequency ranges that can be resolved in the case of the color arrangement shown in FIG. 9(*a*). In FIG. 9(*a*), the control unit 47 of the image sensor 4 has disposed R pixel blocks 20 having four R pixels 10 in a 2×2 array, G pixel blocks 20 having four G pixels 10 in a 2×2 array, and B pixel blocks 20 having four B pixels 10 in a 2×2 array according to a Bayer array.

Pixel columns in which R pixel blocks 20 and G pixel blocks 20 are disposed alternatingly along the row direction with gaps 2*d* between them and pixel columns in which G pixel blocks 20 and B pixel blocks 20 are disposed alternatingly along the row direction with gaps 2*d* between them are set up alternatingly along the column direction. In the Bayer array, the gaps (4*d*) between R pixel blocks 20 in the horizontal direction (i.e. the row direction) and the gaps (4*d*) between R pixel blocks 20 in the vertical direction (i.e. the column direction) are the same. In a similar manner, the gaps (4*d*) between G pixel blocks 20 in the horizontal direction (i.e. the row direction) and the gaps (4*d*) between G pixel blocks 20 in the vertical direction (i.e. the column direction) are the same, and the gaps (4*d*) between B pixel blocks 20 in the horizontal direction (i.e. the row direction) and the gaps (4*d*) between B pixel blocks 20 in the vertical direction (i.e. the column direction) are the same.

FIG. 9(*b*) shows the spatial frequency ranges that can be resolved of the R pixel blocks 20, the G pixel blocks 20, and the B pixel blocks 20 of the Bayer array of FIG. 9(*a*). In FIG. 9(*b*), the spatial frequency ranges of the G pixel blocks 20 that can be resolved are shown by the solid line, and the spatial frequency ranges of the R pixel blocks 20 and of the B pixel blocks 20 that can be resolved are shown by the dotted line. In this manner, with a Bayer array, the spatial frequency ranges of the G pixel blocks 20 that can be resolved are the same in the horizontal direction and in the vertical direction, and moreover the spatial frequency ranges of the R pixel blocks 20 and of the B pixel blocks 20 that can be resolved are the same in the horizontal direction and in the vertical direction.

In a similar manner to the case with the first embodiment, this type of Bayer array is employed in the first photographic mode regardless of the spatial frequency characteristics of the subject image, and is also employed in the second photographic mode when the third spatial frequency characteristic has been detected by the frequency characteristic detection unit 213.

Figure 10:
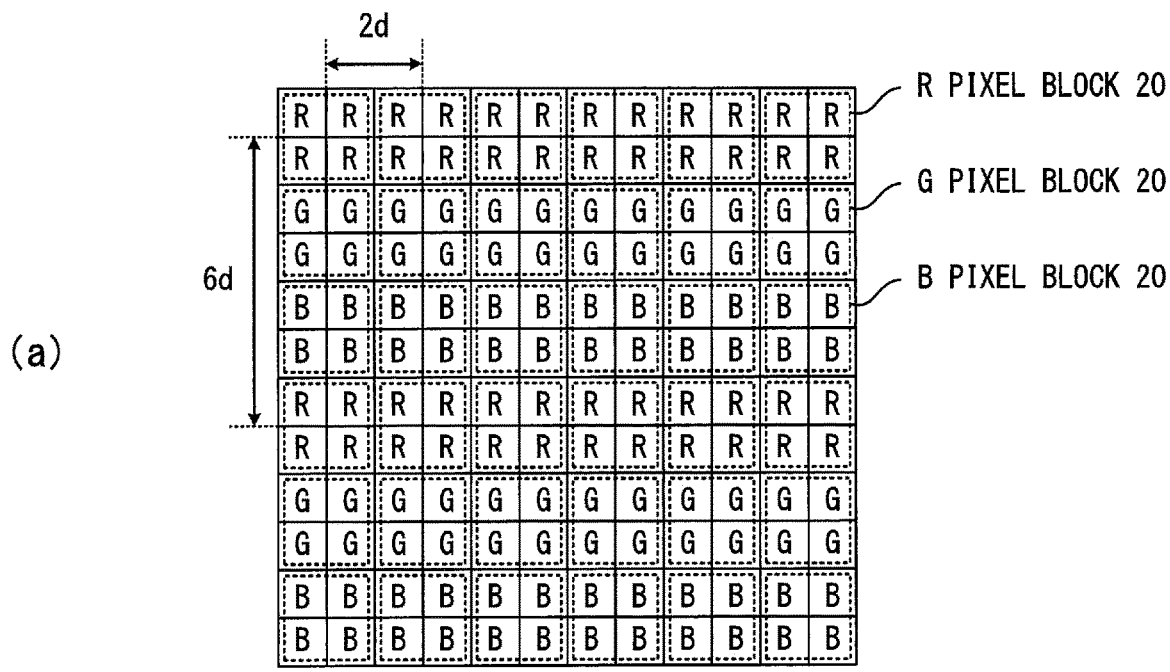
FIG. 10 is another figure showing a color filter arrangement and spatial frequency ranges due to variable wavelength filters of this image sensor according to the second embodiment.
Figure 10:
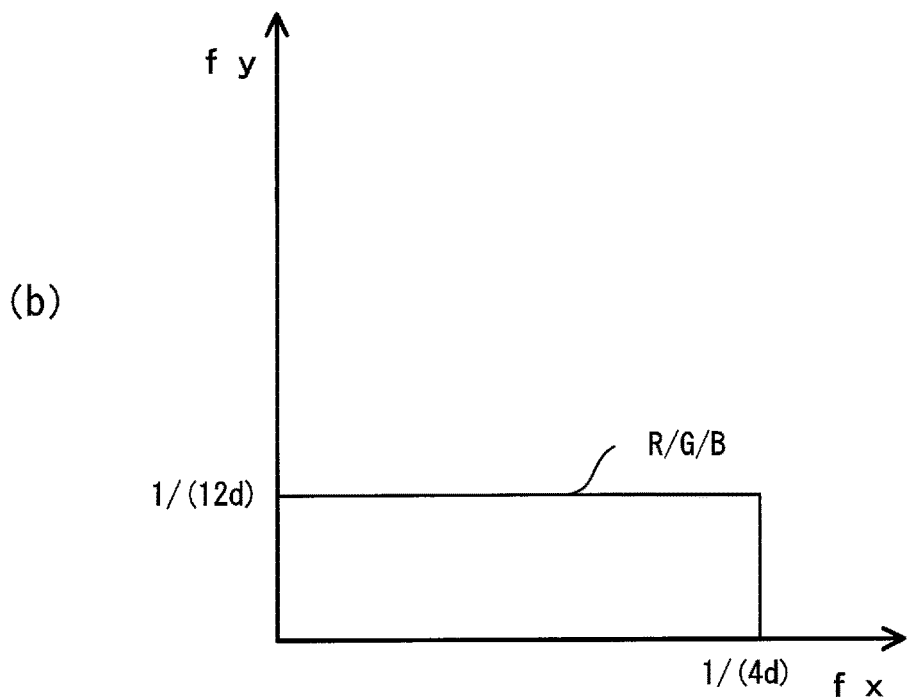

FIG. 10(*a*) is a figure showing the pixel color arrangement in the second filter control mode of the filter control unit 214. And FIG. 10(*b*) is a figure showing the spatial frequency ranges that can be resolved in the case of the color arrangement shown in FIG. 10(*a*).

In FIG. 10(*a*), pixel columns in which R pixel blocks 20 are disposed sequentially in the row direction with gaps 2*d* between them, pixel columns in which G pixel blocks 20 are disposed sequentially in the row direction with gaps 2*d* between them, and pixel columns in which B pixel blocks 20 are disposed sequentially in the row direction with gaps 2*d* between them are established repeatedly in turn along the column direction. Accordingly, the R pixel blocks 20, the G pixel blocks 20, and the B pixel blocks 20 are each disposed at intervals 6d in the column direction.

Since, as described above, the R pixel blocks 20, the G pixel blocks 20, and the B pixel blocks 20 are each disposed with gaps 2d between them in the row direction and are disposed with gaps 6d between them in the column direction, accordingly, as shown in FIG. 10(b), the spatial frequency ranges that can be resolved with this type of pixel color arrangement have resolutions in the horizontal direction (i.e. the row direction) that are higher than the resolutions in the vertical direction (i.e. in the column direction).

This type of array of R pixel blocks, G pixel blocks, and B pixel blocks illustrated in FIG. 10(a) in which the layout along the horizontal direction is emphasized is employed when, during the second photographic mode, the first spatial frequency characteristic has been detected by the frequency characteristic detection unit 213.

FIG. 11(a) is a figure showing the pixel color arrangement in the third filter control mode of the filter control unit 214. And FIG. 11(b) is a figure showing the spatial frequency ranges that can be resolved in the case of the color arrangement shown in FIG. 11(a).

In FIG. 11(a), pixel columns in which R pixel blocks 20 are disposed sequentially in the column direction with gaps 2d between them, pixel columns in which G pixel blocks 20 are disposed sequentially in the column direction with gaps 2d between them, and pixel columns in which B pixel blocks 20 are disposed sequentially in the column direction with gaps 2d between them are set up repeatedly in turn along the row direction. Accordingly, the R pixel blocks 20, the G pixel blocks 20, and the B pixel blocks 20 are each disposed at intervals 6d in the row direction.

Since, as described above, the R pixel blocks 20, the G pixel blocks 20, and the B pixel blocks 20 are disposed with gaps 2d between them in the column direction and are disposed with gaps 6d between them in the row direction, accordingly, as shown in FIG. 11(b), the spatial frequency ranges that can be resolved with this type of pixel color arrangement have resolutions in the vertical direction (i.e. the column direction) that are higher than the resolutions in the horizontal direction (i.e. in the row direction).

This type of array of R pixel blocks, G pixel blocks, and B pixel blocks illustrated in FIG. 11(a) in which the layout along the vertical direction is emphasized is employed when, during the second photographic mode, the second spatial frequency characteristic has been detected by the frequency characteristic detection unit 213.

Next, the operation of the camera 1 of this embodiment will be explained. The camera 1 of this embodiment performs processing similar to that shown in the flow chart of FIG. 7. In step S100, the camera 1 executes the first filter control mode, and sets the pixel color arrangement to a Bayer array, as shown in FIG. 9(a). In step S150 through step S190, the camera 1 performs processing to change the pixel color arrangement on the basis of the spatial frequency characteristics of the subject image. If the first spatial frequency characteristic is detected, then the camera 1 executes the second filter control mode and establishes the pixel color arrangement shown in FIG. 10(a) in which the layout along the horizontal direction is emphasized, whereas, if the second spatial frequency characteristic is detected, then the camera 1 executes the third filter control mode and establishes the pixel color arrangement shown in FIG. 11(a) in which the layout along the vertical direction is emphasized. But if the camera 1 does not detect either the first spatial frequency characteristic or the second spatial frequency characteristic, then it sets the pixel color arrangement to a Bayer array.

Figure 11:
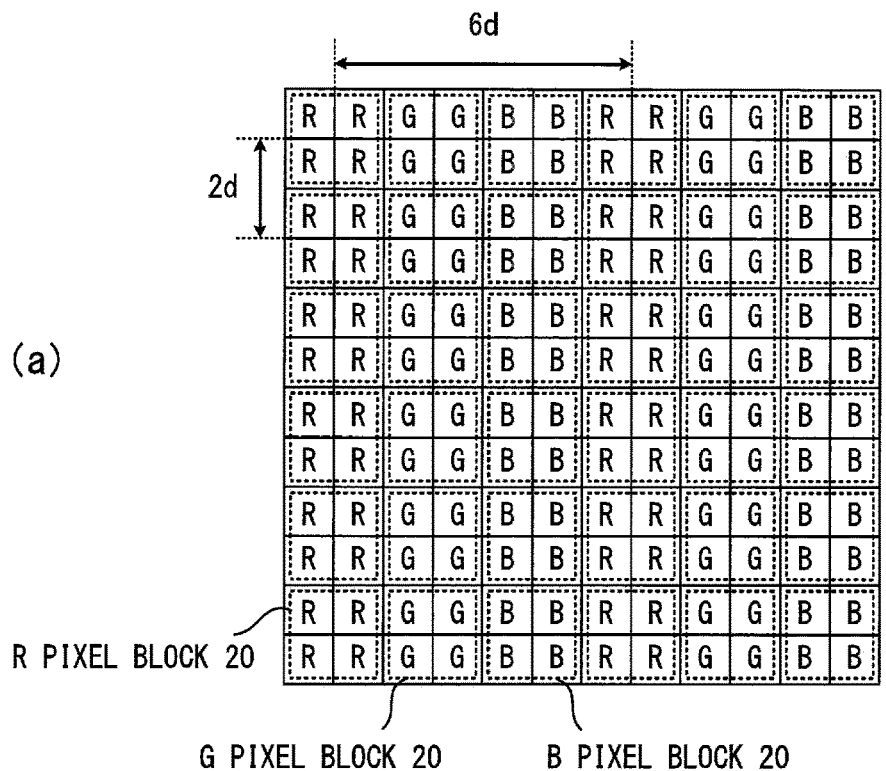
FIG. 11 is yet another figure showing a color filter arrangement and spatial frequency ranges due to variable wavelength filters of this image sensor according to the second embodiment.
Figure 11:
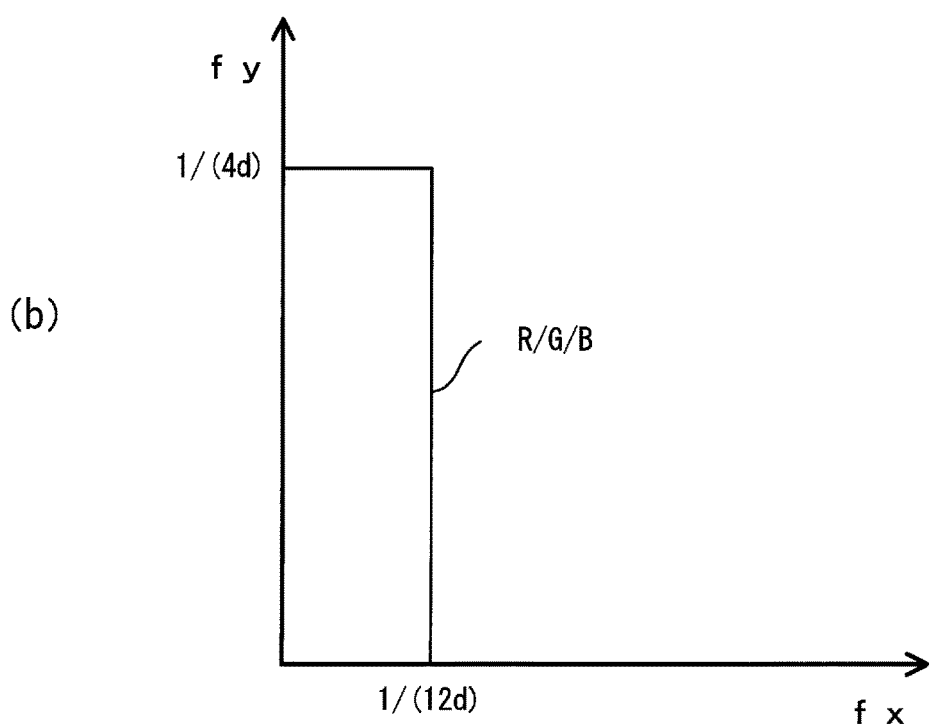

As described above, with this embodiment, by controlling the variable wavelength filters 72 of the image sensor 4, along with being capable of determining the size of the pixel blocks, the camera 1 is also capable of varying the resolution in the horizontal direction and the resolution in the vertical direction. In other words, for example, the camera 1 is capable of changing over between providing a good balance of the resolutions in the horizontal direction and in the vertical direction as shown in FIG. 9, and providing a higher resolution in the horizontal direction as shown in FIG. 10, and providing a higher resolution in the vertical direction as shown in FIG. 11.

Third Embodiment

An imaging device according to a third embodiment will now be explained with reference to the drawings. The main differences between this third embodiment and the second embodiment are as follows. In the case of the second embodiment, in the arrangement which emphasizes the layout along the horizontal direction, as shown in FIG. 10(a), in the row direction, the gaps 2d between the R pixel blocks, the gaps 2d between the G pixel blocks, and the gaps 2d between the B pixel blocks are all the same as one another. In a similar manner, in the column direction, the gaps 6d between the R pixel blocks, the gaps 6d between the G pixel blocks, and the gaps 6d between the B pixel blocks are all the same as one another. Moreover, in the case of the second embodiment, in the arrangement which emphasizes the layout along the vertical direction, as shown in FIG. 11(a), in the column direction, the gaps 2d between the R pixel blocks, the gaps 2d between the G pixel blocks, and the gaps 2d between the B pixel blocks are all the same as one another. In a similar manner, in the row direction, the gaps 6d between the R pixel blocks, the gaps 6d between the G pixel blocks, and the gaps 6d between the B pixel blocks are all the same as one another.

However, in the case of this third embodiment, in the arrangement which emphasizes the layout along the horizontal direction and in the arrangement which emphasizes the layout along the vertical direction, the mutual gaps between the G pixel blocks, the mutual gaps between the R pixel blocks, and the mutual gaps between the B pixel blocks are different. The other structures are the same as those in the second embodiment.

In this embodiment, in the first filter control mode, in a similar manner to the case with the second embodiment, the filter control unit 214 arranges the R pixel blocks 20, the G pixel blocks 20, and the B pixel blocks 20 in the Bayer array of FIG. 9(a). And, also in a similar manner, in the second filter control mode, the filter control unit 214 arranges the R pixel blocks 20, the G pixel blocks 20, and the B pixel blocks 20 so that their layout along the horizontal direction is emphasized as in FIG. 12(a), and, in the third filter control mode, arranges them so that their layout along the vertical direction is emphasized as in FIG. 13(a).

FIG. 12(a) is a figure showing the arrangement of the colors of the pixels by the filter control unit 214 in the second filter control mode, in which the layout along the horizontal direction is emphasized. And FIG. 12(b) shows the spatial frequency ranges that can be resolved in the case of the color arrangement of FIG. 12(a).

In FIG. 12(a), pixel columns in which R pixel blocks 20 and B pixel blocks 20 are disposed alternatingly in the row direction with gaps 2d between them and pixel columns in which G pixel blocks 20 are disposed sequentially in the row direction with gaps 2d between them are disposed repeatedly along the column direction. Accordingly, in the row direction, G pixel blocks 20 are disposed with gaps 2d between them, and R pixel blocks 20 and B pixel blocks 20 are each disposed with gaps 4d between them. Moreover, in the column direction, G pixel blocks 20 are disposed with gaps 4d between them, and R pixel blocks 20 and B pixel blocks 20 are each disposed with gaps 8d between them.

In this manner, with the pixel color arrangement shown in FIG. 12(a) in which the layout along the horizontal direction is emphasized, the gaps 4d between the R pixel blocks 20 in the row direction become smaller than the gaps 8d between the R pixel blocks 20 in the column direction. In a similar manner, the gaps 2d between the G pixel blocks 20 in the row direction become smaller than the gaps 4d between the G pixel blocks 20 in the column direction, and also the gaps 4d between the B pixel blocks 20 in the row direction become smaller than the gaps 8d between the B pixel blocks 20 in the column direction. Moreover, the gaps 2d between the G pixel blocks 20 in the row direction become smaller than the gaps 4d in the row direction between the R pixel blocks 20 and also smaller than the gaps 4d in the row direction between the B pixel blocks 20. Furthermore, the gaps 4d between the G pixel blocks 20 in the column direction become smaller than the gaps 8d in the column direction between the R pixel blocks 20 and also smaller than the gaps 8d in the column direction between the B pixel blocks 20.

As shown in FIG. 12(b), for the spatial frequency ranges that can be resolved in the case described above of arrangement in which the layout along the horizontal direction is emphasized, the resolution in the horizontal direction (i.e. the row direction) is higher than the resolution in the vertical direction (i.e. in the column direction).

This type of arrangement of the R pixel blocks, the G pixel blocks, and the B pixel blocks in which the layout along the horizontal direction is emphasized is employed when, during the second photographic mode, the first spatial frequency characteristic has been detected by the frequency characteristic detection unit 213.

FIG. 13(a) is a figure showing the arrangement of the colors of the pixels by the filter control unit 214 in the third filter control mode, in which the layout along the vertical direction is emphasized. And FIG. 13(b) shows the spatial frequency ranges that can be resolved in the case of the color arrangement of FIG. 13(a).

In FIG. 13(a), pixel columns in which G pixel blocks 20 are disposed repeatedly in the column direction with gaps 2d between them and pixel columns in which R pixel blocks 20 and B pixel blocks 20 are disposed alternatingly in the column direction with gaps 2d between them are disposed repeatedly along the row direction. Accordingly, in the column direction, G pixel blocks 20 are disposed with gaps 2d between them, and R pixel blocks 20 and B pixel blocks 20 are each disposed with gaps 4d between them. Moreover, in the row direction, G pixel blocks 20 are disposed with gaps 4d between them, and R pixel blocks 20 and B pixel blocks 20 are each disposed with gaps 8d between them.

In this manner, with the pixel color arrangement shown in FIG. 13(a) in which the layout along the vertical direction is emphasized, the gaps 4d between the R pixel blocks 20 in the column direction become smaller than the gaps 8d between the R pixel blocks 20 in the row direction. In a similar manner, the gaps 2d between the G pixel blocks 20 in the column direction become smaller than the gaps 4d between the G pixel blocks 20 in the row direction, and also the gaps 4d between the B pixel blocks 20 in the column direction become smaller than the gaps 8d between the B pixel blocks 20 in the row direction. Moreover, the gaps 2d between the G pixel blocks 20 in the column direction become smaller than the gaps 4d in the column direction between the R pixel blocks 20 and also smaller than the gaps 4d in the column direction between the B pixel blocks 20. Furthermore, the gaps 4d between the G pixel blocks 20 in the row direction become smaller than the gaps 8d in the row direction between the R pixel blocks 20 and also smaller than the gaps 8d in the row direction between the B pixel blocks 20.

As shown in FIG. 13(b), for the spatial frequency ranges that can be resolved in the case described above of arrangement in which the layout along the vertical direction is emphasized, the resolution in the vertical direction (i.e. column direction) is higher than the resolution in the horizontal direction (i.e. in the row direction).

This type of arrangement of the R pixel blocks, the G pixel blocks, and the B pixel blocks in which the layout along the vertical direction is emphasized is employed when, during the second photographic mode, the second spatial frequency characteristic has been detected by the frequency characteristic detection unit 213.

Next, the operation of this embodiment will be explained. The camera 1 of this embodiment performs processing similar to that shown in the flow chart of FIG. 7. In step S100, the camera 1 executes the first filter control mode, and sets the pixel color arrangement to a Bayer array, as shown in FIG. 9(a). In step S150 through step S190, the camera 1 performs processing to change the pixel color arrangement on the basis of the spatial frequency characteristic of the subject image. If the first spatial frequency characteristic is detected, then the camera 1 executes the second filter control mode and establishes the pixel color arrangement shown in FIG. 12(a) in which the layout along the horizontal direction is emphasized, whereas, if the second spatial frequency characteristic is detected, then the camera 1 executes the third filter control mode and establishes the pixel color arrangement shown in FIG. 13(a) in which the layout along the vertical direction is emphasized. But if the camera 1 does not detect either the first spatial frequency characteristic or the second spatial frequency characteristic, then it sets the pixel color arrangement to a Bayer array.

Figure 12:
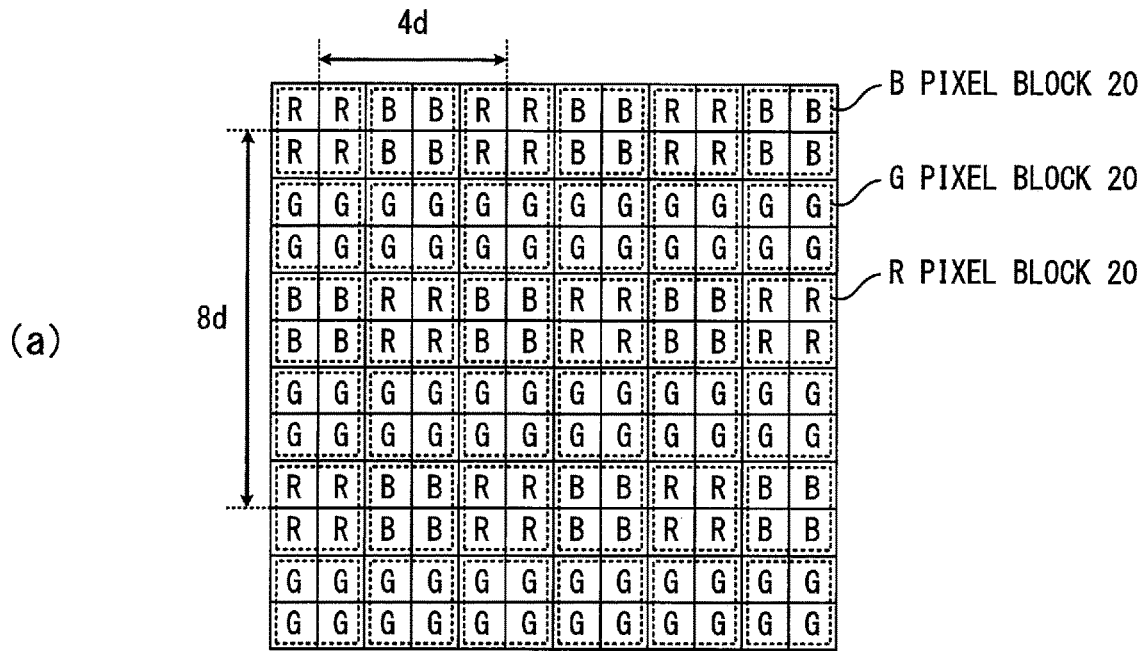
FIG. 12 is a figure showing a color filter arrangement and spatial frequency ranges due to variable wavelength filters of an image sensor according to a third embodiment.
Figure 12:
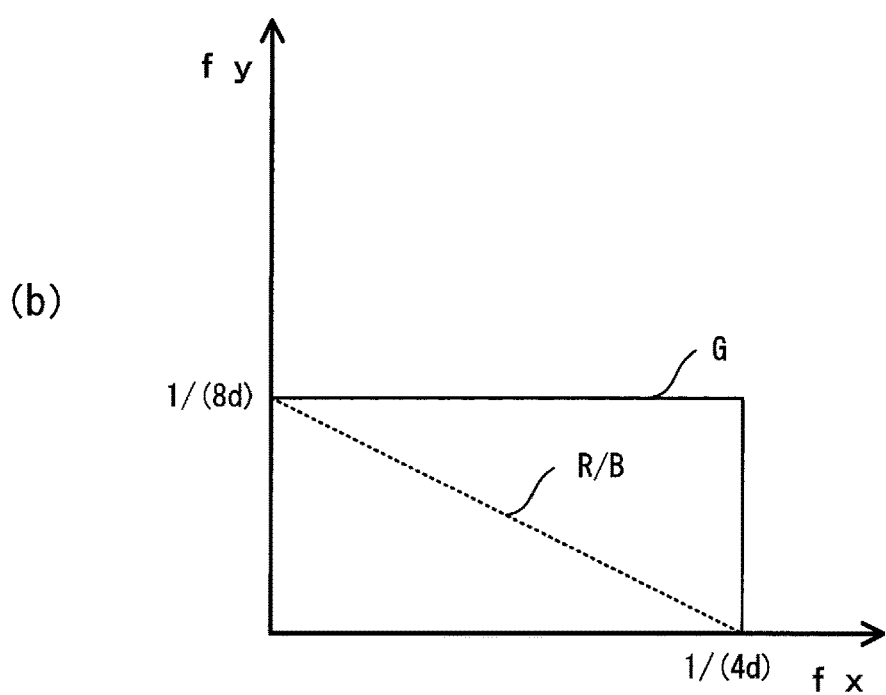
Figure 13:
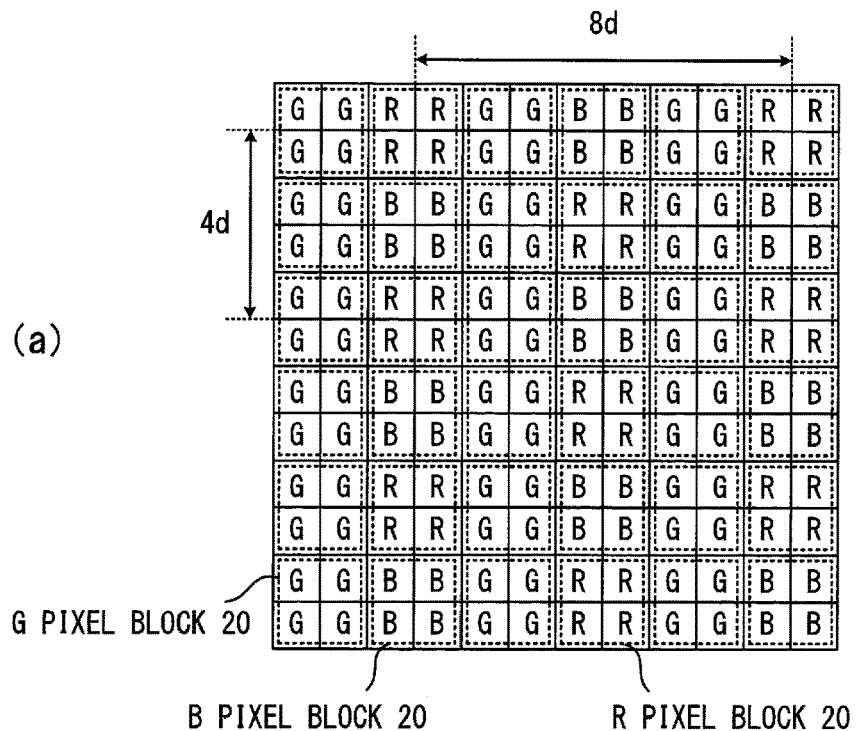
FIG. 13 is another figure showing a color filter arrangement and spatial frequency ranges due to variable wavelength filters of this image sensor according to the third embodiment.
Figure 13:
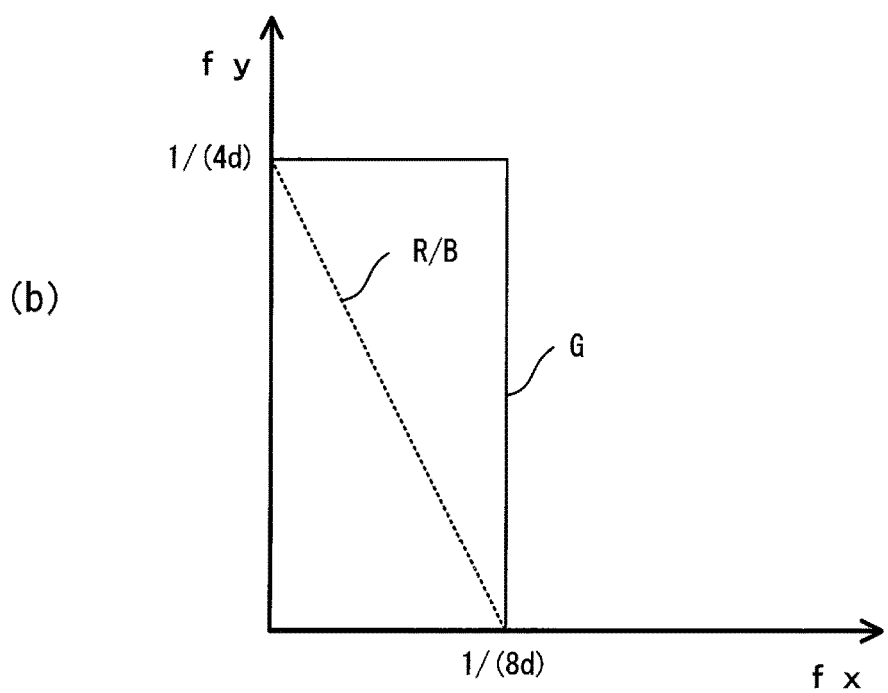

As described above, in this embodiment, for example, the camera 1 is capable of changing over between providing a good balance of the resolutions in the horizontal direction and in the vertical direction as shown in FIG. 9, and providing a higher resolution in the horizontal direction as shown in FIG. 12, and providing a higher resolution in the vertical direction as shown in FIG. 13.

Figure 14:
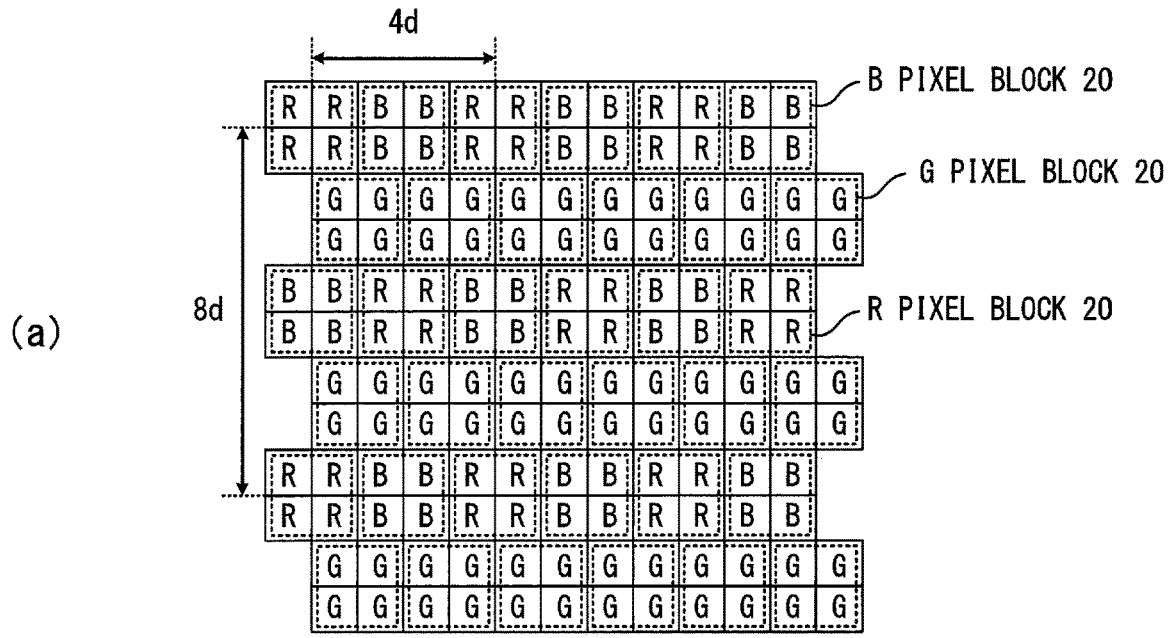
FIG. 14 is a figure showing a color filter arrangement due to variable wavelength filters of this image sensor according to the third embodiment.
Figure 14:
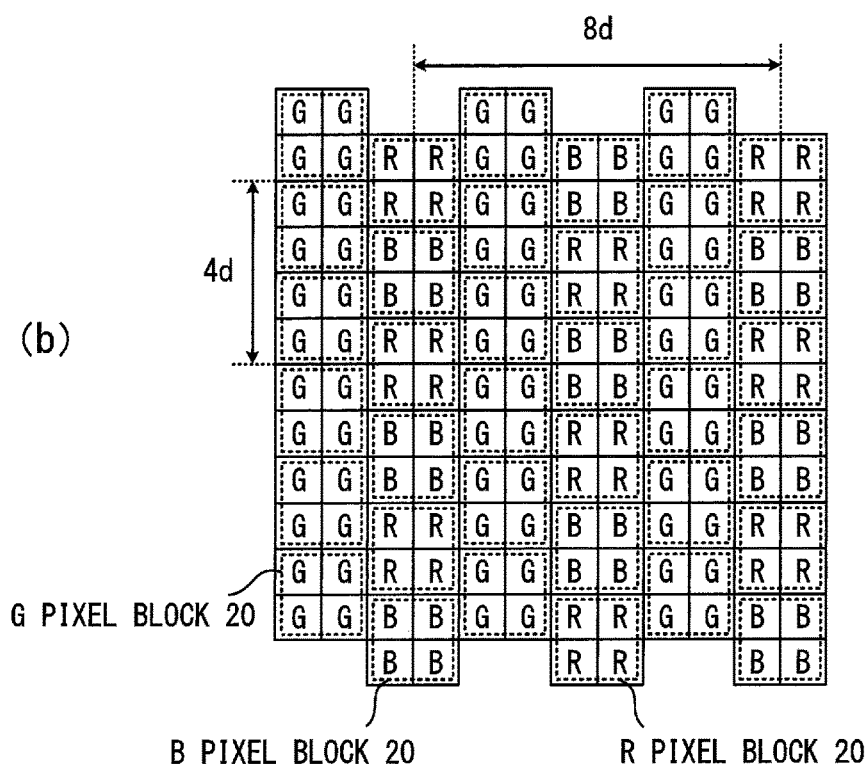

It should be understood that, when changing over to a pixel color arrangement in which the layout along the horizontal direction is emphasized, instead of changing over to the pixel color arrangement shown in FIG. 12(a), it would also be acceptable to arrange to change over to the pixel color arrangement shown in FIG. 14(a). In the pixel color arrangement shown in FIG. 14(a), pixel columns in which R pixel blocks 20 and B pixel blocks 20 are disposed alternatingly along the row direction with gaps 2d between them, and pixel columns in which G pixel blocks 20 are disposed continuously along the row direction with gaps 2d between them, are disposed repeatedly in the column direction with half-block deviations, in other words while being shifted by intervals of just d. The spatial frequency ranges that can be resolved in the case of the color arrangement of FIG. 14(a) are the same as the spatial frequency ranges shown in FIG. 12(b).

Moreover, when changing over to a pixel color arrangement in which the layout along the vertical direction is emphasized, instead of changing over to the pixel color arrangement shown in FIG. 13(a), it would also be acceptable to arrange to change over to the pixel color arrangement shown in FIG. 14(b). In the pixel color arrangement shown in FIG. 14(b), pixel columns in which G pixel blocks 20 are disposed continuously along the column direction with gaps 2d between them, and pixel columns in which R pixel blocks 20 and B pixel blocks 20 are disposed alternatingly along the column direction with gaps 2d between them, are disposed repeatedly in the column direction with half-block deviations, in other words while being shifted by intervals of just d. The spatial frequency ranges that can be resolved in the case of the color arrangement of FIG. 14(b) are the same as the spatial frequency ranges shown in FIG. 13(b).

In this manner, when the arrangement of the color of the pixels shown in FIG. 14(a) in which the layout along the horizontal direction is emphasized and the arrangement of the color of the pixels shown in FIG. 14(b) in which the layout along the vertical direction is emphasized are employed, and also in the case of the Bayer array shown in FIG. 9, it is possible to provide these arrangements while relatively shifting the color arrangement of the pixels in the odd numbered rows and the color arrangement of the pixels in the even numbered rows by half a block each in the column direction, in other words while shifting them by gaps (pitch) of just d.

Furthermore, the relative displacement described above, in the arrangement in which the layout along the horizontal direction is emphasized, of the color arrangement of the pixels in the odd numbered rows and the color arrangement of the pixels in the even numbered rows, the relative displacement described above, in the arrangement in which the layout along the vertical direction is emphasized, of the color arrangement of the pixels in the odd numbered columns and the color arrangement of the pixels in the even numbered columns, and a similar displacement of a Bayer array, can each also be applied to the arrangement in which the layout along the horizontal direction is emphasized of FIG. 5(a), the arrangement in which the layout along the vertical direction is emphasized of FIG. 6(a), and the Bayer array of FIG. 4(a).

The following variants also come within the scope of the present invention; and it would also be possible to combine one or more of the following variant embodiments with one or more of the embodiments described above.

Variant Embodiment 1

In the first embodiment described above an example has been explained in which, when changing over from a Bayer array to an arrangement in which the layout along the horizontal direction is emphasized or to an arrangement in which the layout along the vertical direction is emphasized, the gaps in the horizontal direction and in the vertical direction were changed for each of the R pixels 10, the G pixels 10, and the B pixels 10. However, it would also be acceptable, while changing the gaps in the horizontal direction and in the vertical direction as described above for one type of pixels (for example, for the G pixels) among the R, G, and B pixels, not to change the gaps for the pixels of the other types (i.e. for the R pixels and for the B pixels), but to leave them at the same gaps in the horizontal direction and in the vertical direction. For example, changing the gaps for only the G pixels would be effective if the frequency characteristic detection unit 213 has determined that, although the high frequency components of the spatial frequencies related to the G component (i.e. the G color) are greatly different in the horizontal direction and in the vertical direction, the high frequency components of the spatial frequencies related to the R component (i.e. for the R color) and related to the B component (i.e. for the B color) are almost equal in the horizontal direction and in the vertical direction, or the like.

Moreover, it would also be acceptable, while changing the gaps in the horizontal direction and in the vertical direction for the pixels of two types among the R, G, and B pixels (for example, for the G pixels and for the B pixels) as described above, to keep the gaps for the remaining pixels (for example, for the R pixels) in the horizontal direction and in the vertical direction the same without changing them. For example, changing the gaps for only the G pixels and the B pixels would be effective if the frequency characteristic detection unit 213 has determined that, although the high frequency components for the spatial frequencies related to the G component and to the B component are greatly different in the horizontal direction and in the vertical direction, the high frequency components of the spatial frequencies related to the R component are almost equal in the horizontal direction and in the vertical direction, or the like.

The change described above of the gaps for only one type of pixels among the R, G, and B pixels, or the change of the gaps for two types of pixels among the R, G, and B pixels, can also be applied to the second embodiment or to the third embodiment. In other words, it would be acceptable to arrange to change the gaps in the horizontal direction and in the vertical direction for only pixel blocks of one type among the R pixel blocks, the G pixel blocks, and the B pixel blocks; or, alternatively, it would be acceptable to arrange to change the gaps in the horizontal direction and in the vertical direction for only pixel blocks of two of those types.

Variant Embodiment 2

It would also be acceptable not to control the variable wavelength filters 72 in the same manner over the entire image sensor 4, but rather to control them only over the photographic subject portion so that the resolution (i.e. the resolving power) becomes appropriate. For example, if a specific photographic subject has been detected by employing a per se known photographic subject recognition technique or the like, then only those of the variable wavelength filters 72 corresponding to that specified photographic subject may be controlled.

Variant Embodiment 3

In the arrangement in which the layout along the horizontal direction is emphasized, the gaps between the pixels or between the pixel blocks are not limited to being the gaps described above; it would also be acceptable to arrange to vary the gaps in the horizontal direction and the gaps in the vertical direction while keeping to the condition that (the gaps in the horizontal direction)<(the gaps in the vertical direction). In a similar manner, in the arrangement in which the layout along the vertical direction is emphasized, the gaps between the pixels or between the pixel blocks are not limited to being the gaps described above; it would also be acceptable to arrange to vary the gaps in the horizontal direction and the gaps in the vertical direction while keeping to the condition that (the gaps in the horizontal direction)> (the gaps in the vertical direction).

Variant Embodiment 4

It would also be possible to perform analysis of the subject image (for example, detection of its spatial frequency components) by employing a signal from a sensor other than the image sensor 4 (for example, a sensor that performs processing that is required for AF, or a sensor for determining the amount of exposure, or the like). In this case, a subject image equivalent to the subject image formed upon the image formation surface of the image sensor 4 by the imaging optical system 31 (i.e. the image formation optical system) of FIG. 1 would be captured by the other sensor described above, and the subject image would be analyzed by the analysis unit 22 on the basis of the pixel signal from this other sensor. For example, the frequency characteristic detection unit 213 of the analysis unit 22 may detect the spatial frequency characteristic of the subject image on the basis of the pixel signal from this other sensor. It should be understood that it is desirable for the pixels disposed on this other sensor to be disposed at gaps equal to those of the pixels of the image sensor 4, in order to detect high frequency components that are similar to those in the case of the embodiments described above.

Variant Embodiment 5

In the embodiments described above, examples were explained in which the color arrangement of the pixels was changed over from a Bayer array to an arrangement in which the layout along the horizontal direction is emphasized or to an arrangement in which the layout along the vertical direction is emphasized, on the basis of the result of detection by the frequency characteristic detection unit 213. Instead of this, it would also be acceptable to arrange to change over the color arrangement of the pixels from a Bayer array to only one of an arrangement in which the layout along the horizontal direction is emphasized or an arrangement in which the layout along the vertical direction is emphasized, on the basis of the result of detection by the frequency characteristic detection unit 213. For example, only when changing over from a Bayer array to an arrangement in which the layout along the horizontal direction is emphasized, the frequency characteristic detection unit 213 may calculate the high frequency component of the spatial frequency of the subject image in the horizontal direction, and change over may be executed to an arrangement in which the layout along the horizontal direction is emphasized if this high frequency component is a predetermined value or greater. In this case of only changing over from a Bayer array to an arrangement in which the layout along the horizontal direction is emphasized, it would also be acceptable to arrange to change over to such an arrangement in which the layout along the horizontal direction is emphasized, if the high frequency component in the horizontal direction is greater than the high frequency component in the vertical direction.

On the other hand, when only changing over from a Bayer array to an arrangement in which the layout along the vertical direction is emphasized, the frequency characteristic detection unit 213 may calculate the high frequency component of the spatial frequency of the subject image in the vertical direction, and change over may be executed to an arrangement in which the layout along the vertical direction is emphasized if this high frequency component is a predetermined value or greater. In this case of only changing over from a Bayer array to an arrangement in which the layout along the vertical direction is emphasized, it would also be acceptable to arrange to change over to such an arrangement in which the layout along the vertical direction is emphasized, if the high frequency component in the vertical direction is greater than the high frequency component in the horizontal direction.

It would also be acceptable to arrange to change over the color arrangement of the pixels from an arrangement in which the layout along the horizontal direction is emphasized to an arrangement in which the layout along the vertical direction is emphasized. In this case, for example, the changeover from the arrangement in which the layout along the horizontal direction is emphasized to the arrangement in which the layout along the vertical direction is emphasized may be performed if the high frequency component in the vertical direction is at least a predetermined amount or more greater than the high frequency component in the horizontal direction. It should be understood that it would also be acceptable to arrange to change over to such an arrangement in which the layout along the vertical direction is emphasized, if the high frequency component in the vertical direction is greater than the high frequency component in the horizontal direction.

Moreover, it would also be acceptable to arrange to change over the color arrangement of the pixels from an arrangement in which the layout along the vertical direction is emphasized to an arrangement in which the layout along the horizontal direction is emphasized. In this case, for example, the changeover from the arrangement in which the layout along the vertical direction is emphasized to the arrangement in which the layout along the horizontal direction is emphasized may be performed if the high frequency component in the horizontal direction is at least a predetermined amount or more greater than the high frequency component in the vertical direction. It should be understood that it would also be acceptable to arrange to change over to such an arrangement in which the layout along the horizontal direction is emphasized, if the high frequency component in the horizontal direction is greater than the high frequency component in the vertical direction.

Variant Embodiment 6

In the embodiments described above, examples were explained in which the frequency characteristic detection unit 213 detected the spatial frequency characteristics in response to half press actuation of the release button. However, it would also be acceptable to arrange for the frequency characteristic detection unit 213 to detect the spatial frequency characteristics in response to full press actuation of the release button.

Variant Embodiment 7

In the embodiments described above, examples have been explained in which the frequency characteristic detection unit 213 detects the spatial frequency characteristic of the subject image as being the second spatial frequency characteristic when the high frequency component of the spatial frequency in the vertical direction is greater than the high frequency component of the special frequency in the horizontal direction by the predetermined amount T1 or greater. However, it would also be acceptable to arrange for the frequency characteristic detection unit 213 to detect the spatial frequency characteristic of the subject image as being the second spatial frequency characteristic when the high frequency component of the spatial frequency in the vertical direction is greater than the high frequency component of the special frequency in the horizontal direction by a predetermined amount T2 or greater, with this predetermined amount T2 being different from the predetermined amount T1.

Variant Embodiment 8

In the embodiments described above, examples have been explained in which still image photography was performed by employing the flow chart of FIG. 7. However, it would also be possible to apply this imaging device in the case of performing photography of a moving image. In this case since it is difficult, during moving image photography, to detect the high frequency components of the spatial frequencies in the horizontal direction and in the vertical direction with an image sensor having an arrangement in which the layout along the horizontal direction is emphasized or an arrangement in which the layout along the vertical direction is emphasized, accordingly it is preferred to perform detection of the spatial frequency components with a sensor that is different from the image sensor 4, as in the case of the third variant embodiment described above.

Variant Embodiment 9

In the embodiments described above, examples have been explained in which the focus detection unit 212 performed processing required for contrast AF on the basis of the signal from the image sensor 4. However, it would also be acceptable for the focus detection unit 212 to be a focus detection unit that performs processing required for phase difference AF on the basis of pixel signals from pixels for focus detection that are provided to the image sensor 4. In this case, in step S120 described above, the focus detection unit 212 would perform the processing required for phase difference AF on the basis of the pixel signals from the pixels for focus detection while the filter control unit 214 is controlling the arrangement of the colors of the pixels to be a Bayer array. Yet further, it would also be acceptable to provide a sensor for focus detection that is different from the image sensor 4 upon an optical path that is branched off from the optical path of the imaging optical system 31, and to arrange to perform the processing required for phase difference AF with this sensor for focus detection.

Variant Embodiment 10

In the embodiments described above, examples have been explained in which each of the variable wavelength filters 72 was composed of three filters, i.e. of an EC layer generating R (red) color, an EC layer generating G (green) color, and an EC layer generating B (blue) color. However, it would also be acceptable to arrange for each of the wavelength filters 72 to be composed of three filters, these being an EC layer generating Mg (magenta) color, an EC layer generating Ye (yellow) color, and an EC layer generating Cy (cyan) color. In this, by combining the transmission wavelengths of these three EC layers, it would become possible for the wavelength filters 72 principally to transmit light in any of the Mg, Ye, Cy, W, BK, R, G, or B wavelength regions. Moreover, it would also be acceptable to employ wavelength filters using liquid crystals for the variable wavelength filters 72.

Variant Embodiment 11

In the embodiments described above, examples have been explained in which photodiodes were employed as the photoelectric conversion units. However, it would also be acceptable to arrange to employ a photoelectric conversion layer as the photoelectric conversion unit.

Variant Embodiment 12

In the embodiments described above, examples have been explained in which the image sensor 4 was built as a back side illuminated type. However, it would also be acceptable to build the image sensor 4 as a front side illuminated type, in which the wiring layer 110 is provided on the incident side upon which light is incident.

Variant Embodiment 13

Any of the image sensors and the imaging devices explained in connection with the embodiments and variant embodiments described above could be applied to a camera, a smart phone, a tablet, a camera internally provided to a PC, a camera on a vehicle, or a camera mounted to an unmanned aircraft (a drone, a radio-controlled craft, or the like), and so on.

While various embodiments and variant embodiments have been explained in the above description, the present invention is not to be considered as being limited to the details thereof. Other variations that are considered to come within the range of the technical concept of the present invention are also included within the scope of the present invention.

The content of the disclosure of the following application, upon which priority is claimed, is hereby installed herein by reference.

Japanese Patent Application 60,527 of 2017 (filed on 27 Mar. 2017).

REFERENCE SIGNS LIST

1: imaging device
3: image sensor
21: body control unit
22: analysis unit
31: imaging optical system
72: variable wavelength filter
75: photoelectric conversion unit
213: frequency characteristic detection unit
214: filter control unit
215: first image data generation unit
216: second image data generation unit

The invention claimed is:
1. An imaging device, comprising:
filters that are capable of changing between a first state of passing light of a first wavelength, and a second state of passing light of a second wavelength, and are arranged in a first direction and a second direction that is different from the first direction;
light reception units that receive light that has passed through the filters; and
a control unit that controls the filters to be in the first state or to be in the second state, wherein
the control unit controls gaps between the filters in the first state in the first direction and gaps between the filters in the first state in the second direction.

2. The imaging device according to claim 1, wherein:
the control unit controls the gaps based upon a detected light from a subject.

3. The imaging device according to claim 1, wherein:
the light reception units receive the light that has passed through the filters, and output signals, and
the control unit controls the gaps based upon an image generated from the signals.

4. The imaging device according to claim 3, further comprising
a detection unit that detects a first spatial frequency component in the first direction, and a second spatial frequency component in the second direction, of the image generated from the signals outputted from the light reception units, wherein:
the control unit controls the gaps based upon the first and second spatial frequency components that have been detected.

5. The imaging device according to claim 4, wherein:
among spatial frequency components of the image, the first and second spatial frequency components are high frequency components.

6. The imaging device according to claim 4, wherein:
the control unit generates a first filter group made up from a plurality of the filters in the first state, and a second filter group made up from a plurality of the filters in the second state; and
the control unit sets gaps between the filters in the first filter group in the first direction to be smaller than gaps between the filters in the first filter group in the second direction when the first spatial frequency component is greater than the second spatial frequency component, and sets the gaps between the filters in the first filter group in the second direction to be smaller than the gaps between the filters in the first filter group in the first direction when the second spatial frequency component is greater than the first spatial frequency component.

7. The imaging device according to claim 6, wherein:
the filters have a third state of passing light of a third wavelength;
the control unit generates a third filter group made up from a plurality of the filters in the third state;
the control unit controls the filters to be in one of the first state, the second state, and the third state; and
if the first spatial frequency component is greater than the second spatial frequency component, the control unit sets gaps between the second filter group and gaps between the third filter group in the first direction to be respectively smaller than gaps between the second filter group and gaps between the third filter group in the second direction; and, if the second spatial frequency component is greater than the first spatial frequency component, the control unit sets the gaps between the second filter group and the gaps between the third filter group in the second direction to be respectively smaller than the gaps between the second filter group and the gaps between the third filter group in the first direction.

8. The imaging device according to claim 7, wherein:
the control unit has a first control of setting the gaps between the filters in the first filter group to be the same, setting the gaps between the filters in the second filter group to be the same, and setting the gaps between the filters in the third filter group to be the same, in the first direction and in the second direction;
the control unit has a second control of setting the gaps between the first filter group, the gaps between the second filter group, and the gaps between the third filter group in the first direction, to be respectively smaller than the gaps between the first filter group, the gaps between the second filter group, and the gaps between the third filter group in the second direction; and
the control unit has a third control of setting the gaps between the first filter group, the gaps between the second filter group, and the gaps between the third filter group in the second direction, to be respectively smaller than the gaps between the first filter group, the gaps between the second filter group, and the gaps between the third filter group in the first direction.

9. The imaging device according to claim 8, wherein:
the control unit controls the filters according to the first control when the difference between the first spatial frequency component and the second spatial frequency component is smaller than a certain amount;
the control unit controls the filters according to the second control when the first spatial frequency component is greater than the second spatial frequency component by a predetermined amount or more; and
the control unit controls the filters according to the third control when the second spatial frequency component is greater than the first spatial frequency component by a predetermined amount or more.

10. The imaging device according to claim 4, wherein:
if the first spatial frequency component is greater than the second spatial frequency component, the control unit sets the gaps between the filters in the first state in the first direction to be smaller than the gaps between the filters in the first state in the second direction.

11. The imaging device according to claim 10, wherein:
if the second spatial frequency component is greater than the first spatial frequency component, the control unit sets the gaps between the filters in the first state in the second direction to be smaller than the gaps between the filters in the first state in the first direction.

12. The imaging device according to claim 11, wherein:
if the first spatial frequency component is greater than the second spatial frequency component, the control unit sets gaps between the filters in the second state in the first direction to be smaller than gaps between the filters in the second state in the second direction; and, if the second spatial frequency component is greater than the first spatial frequency component, the control unit sets the gaps between the filters in the second state in the second direction to be smaller than the gaps between the filters in the second state in the first direction.

13. The imaging device according to claim 12, wherein:
the filters have a third state of passing light of a third wavelength;
the control unit controls the filters to be in one of the first state, the second state, and the third state; and
if the first spatial frequency component is greater than the second spatial frequency component, the control unit sets gaps between the filters in the third state in the first direction to be smaller than gaps between the filters in the third state in the second direction; and, if the second spatial frequency component is greater than the first spatial frequency component, the control unit sets the gaps between the filters in the third state in the second direction to be smaller than the gaps between the filters in the third state in the first direction.

14. The imaging device according to claim 13, wherein:
the control unit has a first control of setting the gaps between the filters in the first state to be the same, setting the gaps between the filters in the second state to be the same, and setting the gaps between the filters in the third state to be the same, in the first direction and in the second direction;

the control unit has a second control of setting the gaps between the filters in the first state, the gaps between the filters in the second state, and the gaps between the filters in the third state in the first direction, to be respectively smaller than the gaps between the filters in the first state, the gaps between the filters in the second state, and the gaps between the filters in the third state in the second direction; and the control unit has a third control of setting the gaps between the filters in the first state, the gaps between the filters in the second state, and the gaps between the filters in the third state in the second direction, to be respectively smaller than the gaps between the filters in the first state, the gaps between the filters in the second state, and the gaps between the filters in the third state in the first direction.

15. The imaging device according to claim 14, wherein:

the control unit controls the filters according to the first control when the difference between the first spatial frequency component and the second spatial frequency component is smaller than a certain amount;

the control unit controls the filters according to the second control when the first spatial frequency component is greater than the second spatial frequency component by a predetermined amount or more; and the control unit controls the filters according to the third control when the second spatial frequency component is greater than the first spatial frequency component by a predetermined amount or more.

16. An image sensor, comprising:

filters that are capable of changing between a first state of passing light of a first wavelength, and a second state of passing light of a second wavelength, and are arranged in a first direction and a second direction that is different from the first direction;

light reception units that receive light that has passed through the filters, and that output signals; and a control unit that controls the filters to the first state or to the second state, based upon the signals outputted from the light reception units, wherein the control unit controls gaps between the filters in the first state in the first direction and gaps between the filters in the first state in the second direction.

17. The image sensor according to claim 16, wherein:

the control unit controls the gaps based upon the signals outputted from the light reception units.

* * * * *